(12) United States Patent
Jung et al.

(10) Patent No.: US 11,737,294 B2
(45) Date of Patent: Aug. 22, 2023

(54) QUANTUM DOT COMPOSITION, LIGHT EMITTING DIODE AND DISPLAY DEVICE INCLUDING THE LIGHT EMITTING DIODE

(71) Applicant: SAMSUNG DISPLAY CO., LTD., Yongin-si (KR)

(72) Inventors: Yunku Jung, Cheonan-si (KR); Hyunmi Doh, Seoul (KR); Jae Hong Park, Seoul (KR); Dongwoo Shin, Seoul (KR); Jaekook Ha, Seoul (KR); Sungwoon Kim, Yongin-si (KR); Minki Nam, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 412 days.

(21) Appl. No.: 16/892,532

(22) Filed: Jun. 4, 2020

(65) Prior Publication Data
US 2021/0091324 A1     Mar. 25, 2021

(30) Foreign Application Priority Data
Sep. 25, 2019     (KR) .................. 10-2019-0117969

(51) Int. Cl.
| | |
|---|---|
| *H10K 50/115* | (2023.01) |
| *C09K 11/08* | (2006.01) |
| *C09K 11/02* | (2006.01) |
| *H10K 30/80* | (2023.01) |
| *H10K 59/35* | (2023.01) |

(Continued)

(52) U.S. Cl.
CPC .......... *H10K 50/115* (2023.02); *C09K 11/025* (2013.01); *C09K 11/08* (2013.01); *H10K 30/865* (2023.02); *H10K 59/35* (2023.02); *H10K 59/38* (2023.02); *H10K 85/654* (2023.02);

(Continued)

(58) Field of Classification Search
CPC ...... C09K 11/025; C09K 11/08; H01L 51/502
See application file for complete search history.

(56) References Cited

U.S. PATENT DOCUMENTS

| | | |
|---|---|---|
| 10,233,387 B2 | 3/2019 | Qiu et al. |
| 10,439,155 B2 | 10/2019 | Park et al. |

(Continued)

FOREIGN PATENT DOCUMENTS

| | | | |
|---|---|---|---|
| CN | 112322278 A | | 2/2021 |
| JP | 2020-066733 | * | 4/2020 |

(Continued)

OTHER PUBLICATIONS

Patrick R. Brown, et al., "Energy Level Modification in Lead Sulfide Quantum Dot Thin Films through Ligand Exchange," ACS Nano; Jun. 2014, vol. 8, Issue: 6, pp. 5863-5872.

(Continued)

*Primary Examiner* — C Melissa Koslow
(74) *Attorney, Agent, or Firm* — Lewis Roca Rothgerber Christie LLP

(57) ABSTRACT

A quantum dot composition includes a quantum dot, and a ligand bonded to a surface of the quantum dot, wherein the ligand includes a body part including a charge transport moiety, and a head part bonded to the surface of the quantum dot. The quantum dot composition according may be applied to a light emitting diode and a display device to provide increased luminous efficiency and device life of the light emitting diode and the display device.

14 Claims, 13 Drawing Sheets

(51) Int. Cl.
  *H10K 59/38* (2023.01)
  *H10K 85/60* (2023.01)
  *H10K 50/15* (2023.01)
  *H10K 50/16* (2023.01)
  *H10K 71/00* (2023.01)

(52) U.S. Cl.
  CPC ......... *H10K 85/6572* (2023.02); *H10K 50/15* (2023.02); *H10K 50/16* (2023.02); *H10K 71/00* (2023.02)

(56) References Cited

U.S. PATENT DOCUMENTS

| | | | |
|---|---|---|---|
| 11,005,060 B2* | 5/2021 | Chung | H01L 51/5056 |
| 11,569,467 B2 | 1/2023 | Jung | |
| 2003/0042850 A1* | 3/2003 | Bertram | H05B 33/14 |
| | | | 313/504 |
| 2007/0279376 A1* | 12/2007 | Park | G09G 3/3413 |
| | | | 345/102 |
| 2008/0206565 A1* | 8/2008 | Takahashi | H05B 33/14 |
| | | | 106/31.13 |
| 2010/0237323 A1 | 9/2010 | Akai et al. | |
| 2012/0032115 A1* | 2/2012 | Harada | H01L 51/0072 |
| | | | 252/301.16 |
| 2012/0248410 A1* | 10/2012 | Murayama | H01L 21/02628 |
| | | | 257/E33.001 |
| 2013/0026426 A1* | 1/2013 | Harada | C07F 5/027 |
| | | | 977/932 |
| 2016/0233449 A1* | 8/2016 | Murayama | H01L 51/5004 |
| 2016/0290600 A1 | 10/2016 | Biederman et al. | |
| 2019/0326539 A1* | 10/2019 | Chung | H01L 51/502 |
| 2020/0067006 A1* | 2/2020 | Ippen | C09K 11/06 |
| 2020/0075877 A1* | 3/2020 | Yu | H01L 51/502 |
| 2020/0259110 A1* | 8/2020 | Angioni | H01L 21/02601 |
| 2022/0135873 A1* | 5/2022 | Gerlitzki | H01L 51/0072 |
| | | | 252/301.36 |
| 2022/0416186 A1* | 12/2022 | Takenaka | H01L 51/502 |

FOREIGN PATENT DOCUMENTS

| | | |
|---|---|---|
| KR | 10-1140309 B1 | 7/2010 |
| KR | 10-1740429 B1 | 3/2012 |
| KR | 10-2016-0057642 A | 5/2016 |
| KR | 10-2017-0132890 A | 12/2017 |
| KR | 10-2019-0029193 A | 3/2019 |
| WO | WO 2021/100104 * | 5/2012 |
| WO | WO 2020/148371 * | 7/2020 |

OTHER PUBLICATIONS

Chia-Hao M. Chuang, et al., "Improved performance and stability in quantum dot solar cells through band alignment engineering," MIT Open Access Articles, Nat Mater, Aug. 2014; 13(8): 796-801. doi:10.1038/nmat3984.

* cited by examiner

QUANTUM DOT COMPOSITION, LIGHT EMITTING DIODE AND DISPLAY DEVICE INCLUDING THE LIGHT EMITTING DIODE

CROSS-REFERENCE TO RELATED APPLICATION

This application claims priority to and the benefit of Korean Patent Application No. 10-2019-0117969, filed on Sep. 25, 2019, the entire contents of which are incorporated herein by reference.

BACKGROUND

1. Field

Embodiments of the present disclosure relate to a quantum dot composition, a light emitting diode including an emission layer formed from the quantum dot composition, and a display device including the light emitting diode.

2. Related Art

Various types of display devices used in multimedia devices such as televisions, cellular phones, tablet computers, navigations and game consoles are being developed. In such display devices, a so-called self-luminescent display device that emits light by illuminating light emitting materials including organic compounds is used.

In addition, in order to improve color reproducibility of display devices, development of a light emitting diode using a quantum dot as a light emitting material is conducted, and the improvement of the reliability and life of a light emitting diode using a quantum dot is beneficial.

SUMMARY

Embodiments of the present disclosure provide a quantum dot composition which is used in an emission layer of a light emitting diode and may show improved luminous efficiency properties.

Embodiments of the present disclosure also provide a light emitting diode having improved charge injection properties by including a quantum dot to which a ligand material is attached on the surface thereof, in an emission layer.

In addition, embodiments of the present disclosure also provide a display device showing improved charge injection properties by including a light emitting diode which includes a quantum dot to which a ligand material is attached on the surface thereof, in an emission layer.

An embodiment of the present disclosure provides a quantum dot composition including a quantum dot, and a ligand bonded to a surface of the quantum dot. The ligand includes a body part having a charge transport moiety, and a head part bonded to the surface of the quantum dot.

In an embodiment, the body part may include a hole transport moiety or an electron transport moiety.

In an embodiment, the body part may be represented by the following Formula 1-1 or Formula 1-2:

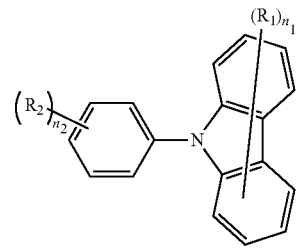

Formula 1-1

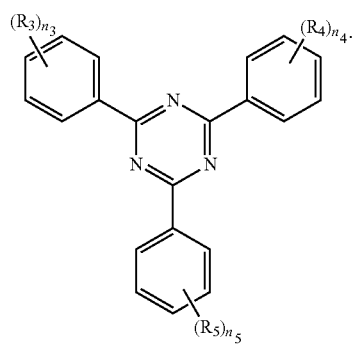

Formula 1-2

In Formula 1-1 and Formula 1-2, $R_1$ to $R_5$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms for forming a ring, or a substituted or unsubstituted heteroaryl group of 2 to 60 carbon atoms for forming a ring, $n_1$ is an integer of 0 to 8, and $n_2$ to $n_5$ are each independently an integer of 0 to 5.

In an embodiment, the ligand may further include a chain part connecting the body part and the head part.

In an embodiment, the chain part may be a substituted or unsubstituted alkyl group, a substituted or unsubstituted amine group, a substituted or unsubstituted oxy group, a substituted or unsubstituted thio group, a substituted or unsubstituted ester group, or a substituted or unsubstituted amide group.

In an embodiment, the ligand may be a monodentate ligand or a bidentate ligand.

In an embodiment, the head part may include at least one thiol group.

In an embodiment, the quantum dot may include a core and a shell at least partially surrounding the core.

In an embodiment, the quantum dot composition of an embodiment of the present disclosure may further include an organic solvent.

In an embodiment of the present disclosure, a light emitting diode includes a first electrode, a hole transport region on the first electrode, an emission layer on the hole transport region and including a quantum dot and a ligand bonded to a surface of the quantum dot, an electron transport region on the emission layer, and a second electrode on the electron transport region. The ligand includes a body part having a charge transport moiety, and a head part bonded to the surface of the quantum dot.

In an embodiment, the hole transport region may include a first hole transport material, and the first hole transport material and the body part may each include a moiety having the same composition.

In an embodiment, the electron transport region may include a first electron transport material, and the first electron transport material and the body part may each include a moiety having the same composition.

In an embodiment, the hole transport region may include a hole injection layer on the first electrode, and a hole transport layer between the hole injection layer and the emission layer, and the electron transport region may include an electron transport layer on the emission layer, and an electron injection layer on the electron transport layer.

In an embodiment of the present disclosure, a display device includes a plurality of light emitting diodes. Each of the light emitting diodes includes a first electrode, a second electrode facing the first electrode, and an emission layer between the first electrode and the second electrode and including a quantum dot and a ligand bonded to a surface of the quantum dot. The ligand includes a body part having charge transport properties, and a head part bonded to the surface of the quantum dot.

In an embodiment, the plurality of light emitting diodes may include a first light emitting diode, and the quantum dot of the first light emitting diode may be a first quantum dot to emit a first light, a second light emitting diode, and the quantum dot of the second light emitting diode may be a second quantum dot to emit a second light having a longer wavelength than the first light, and a third light emitting diode, and the quantum dot of the third light emitting diode may be a third quantum dot to emit a third light having a longer wavelength than the first light and the second light.

In an embodiment, the ligand of the first light emitting diode may be a first ligand bonded to the first quantum dot, the ligand of the second light emitting diode may be a second ligand bonded to the second quantum dot, and the ligand of the third light emitting diode may be a third ligand bonded to the third quantum dot.

In an embodiment, the display device according to an embodiment of the present disclosure may further include a color filter layer on the plurality of light emitting diodes. The color filter layer may include a first filter to transmit the first light, a second filter to transmit the second light, and a third filter to transmit the third light.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
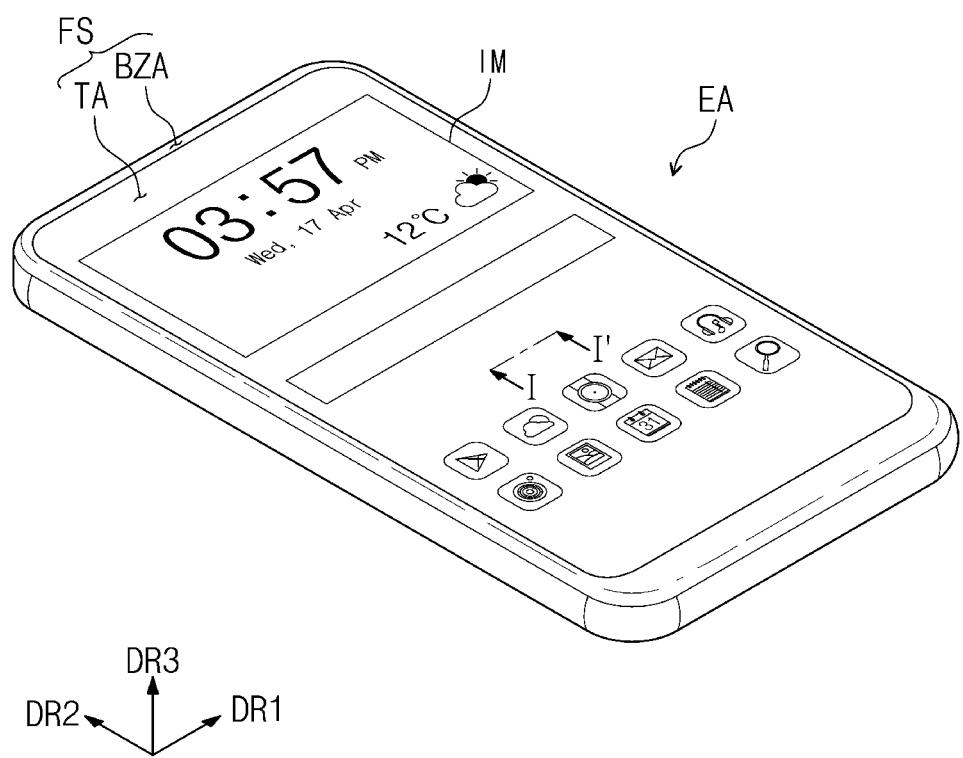
FIG. 1 is a combination perspective view of an electronic device of an embodiment.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element (or region, layer, part, etc.) is referred to as being "on," "connected to," or "coupled to" another element, it can be directly on, connected or coupled to the other element or a third intervening elements may be present.

Meanwhile, the terms "directly contacted" or "directly on" in the present disclosure may mean no additional layer, film, region, plate, etc. is present between a part such as a layer, a film, a region, a plate, etc. and another part. For example, when an element is referred to as being "directly contacted" or "directly on," two layers or two units are present without using an additional unit such as an adhesive unit therebetween.

Like reference numerals refer to like elements throughout. In addition, in the drawings, the thickness, the ratio, and the dimensions of constituent elements may be exaggerated for effective explanation of technical contents.

The term "and/or" includes one or more combinations which may be defined by relevant elements.

It will be understood that, although the terms "first", "second," etc. may be used herein to describe various elements, these elements should not be limited by these terms. These terms are only used to distinguish one element from another element. Thus, a first element could be termed a second element without departing from the spirit and scope of the present disclosure. Similarly, a second element could be termed a first element. As used herein, the singular forms are intended to include the plural forms as well, unless the context clearly indicates otherwise.

In addition, the terms "below," "beneath," "on," and "above" are used for explaining the relation of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, a quantum dot composition, a light emitting diode and a display device including the same according to embodiments of the present disclosure will be explained with reference to the accompanying drawings.

Figure 2:
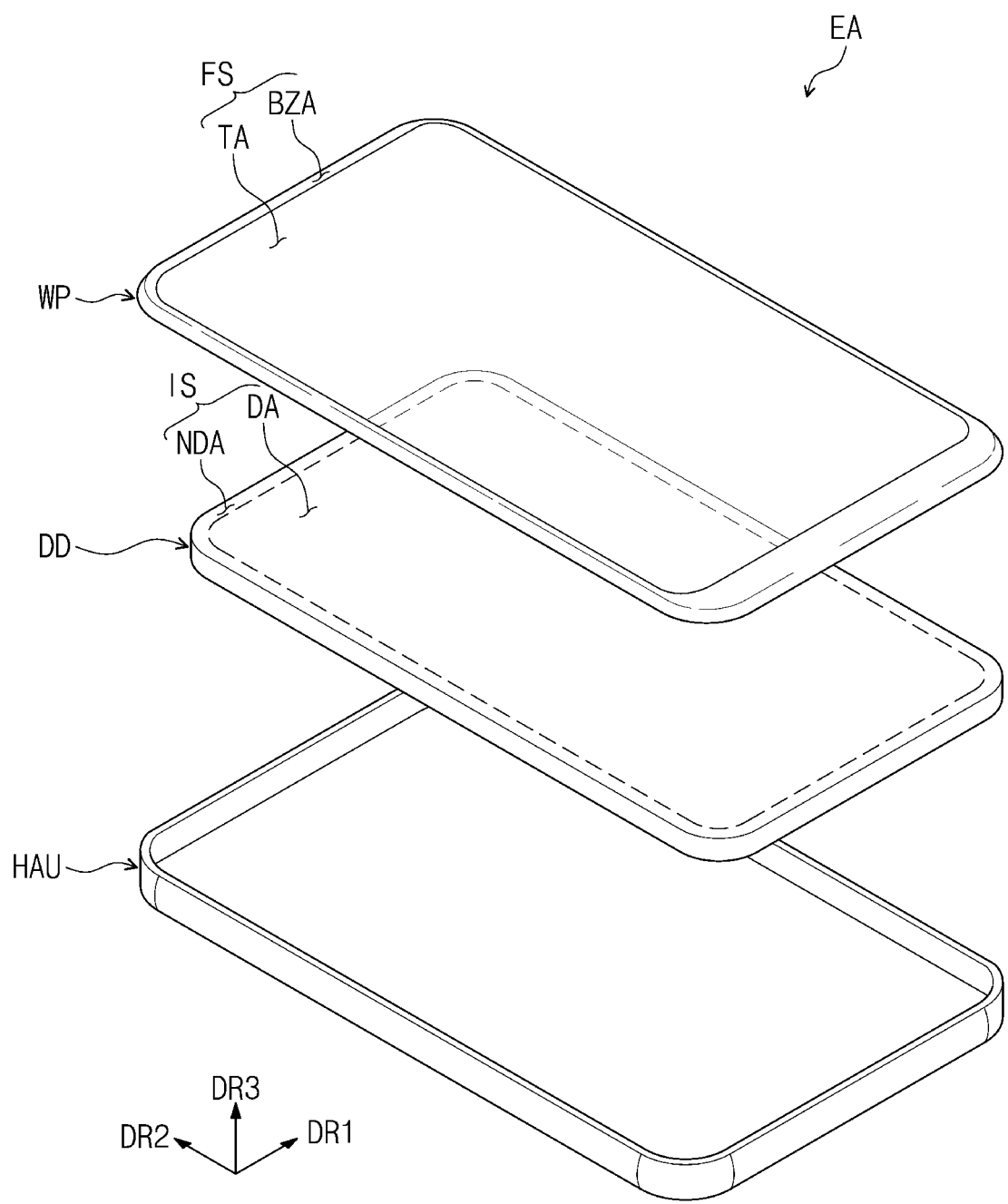
FIG. 2 is an exploded perspective view of an electronic device of an embodiment of FIG. 1.
Figure 3:
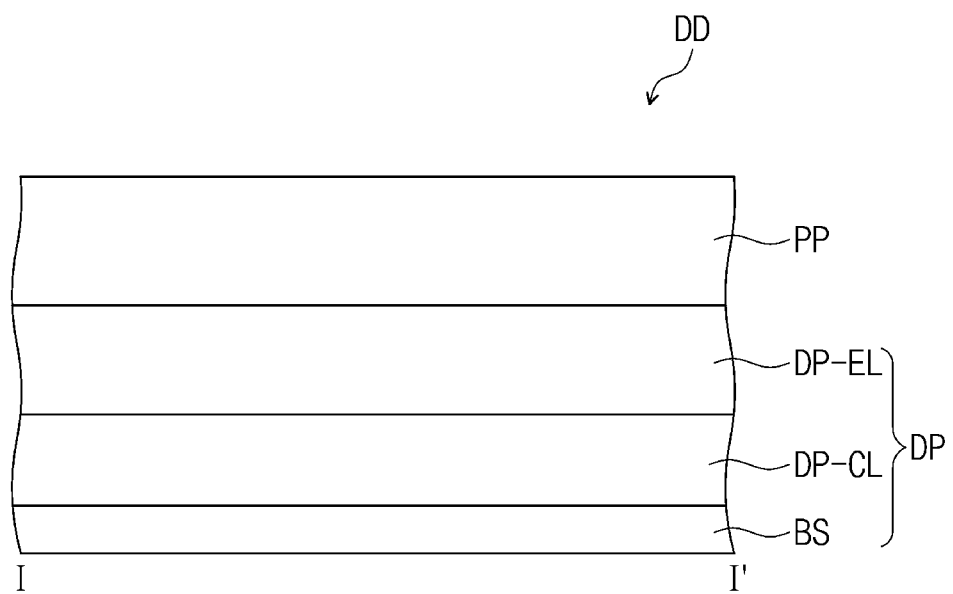
FIG. 3 is a cross-sectional view of a display device of an embodiment taken along line I-I' of FIG. 1.
Figure 4:
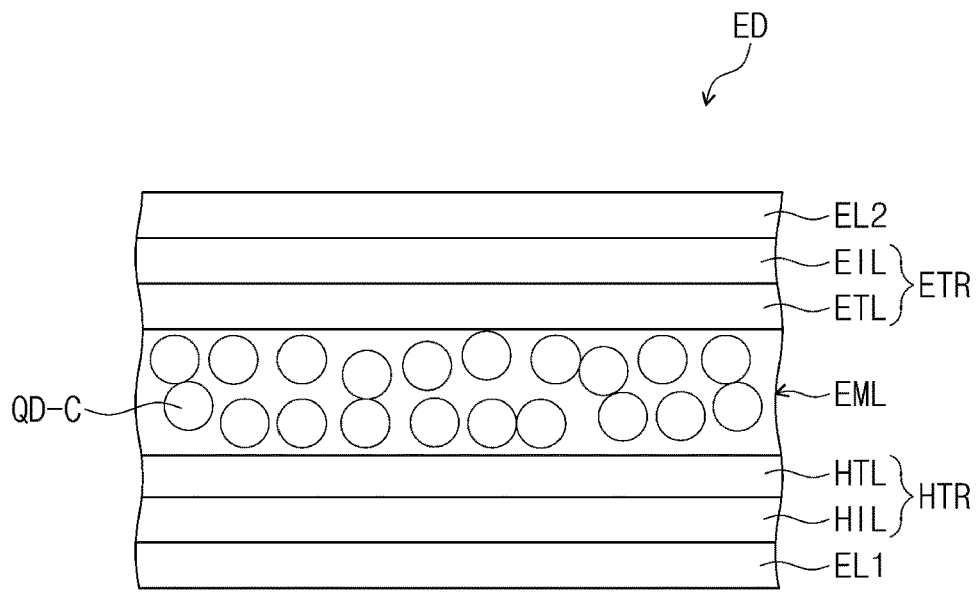
FIG. 4 is a cross-sectional view of a light emitting diode of an embodiment.
Figure 5:
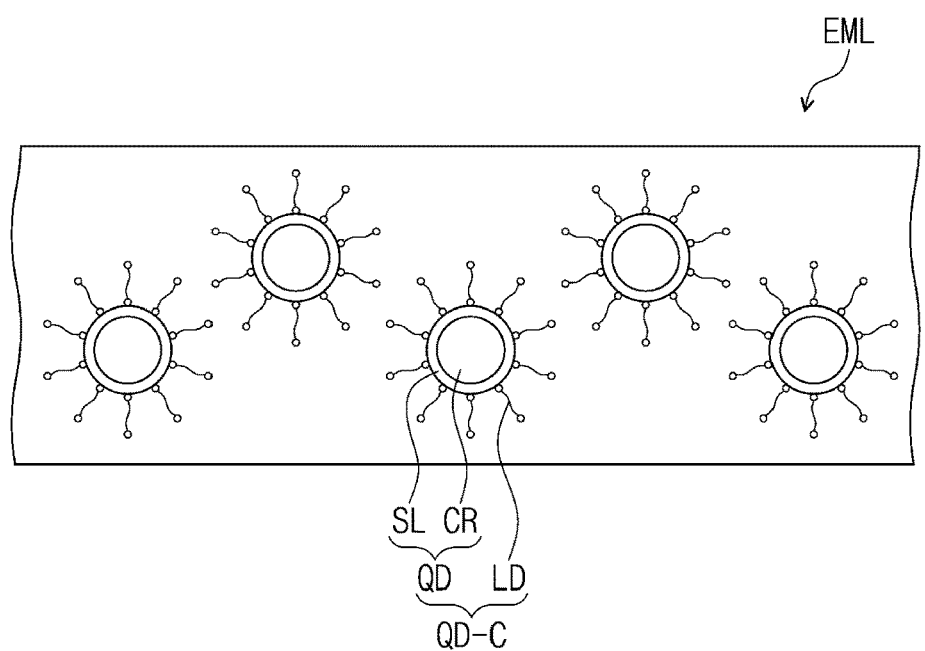
FIG. 5 is a cross-sectional view showing a part of a light emitting diode of an embodiment of FIG. 4.

FIG. 1 is a perspective view showing an embodiment of an electronic device EA. FIG. 2 is an exploded perspective view of an electronic device EA of an embodiment. FIG. 3 is a cross-sectional view of a display device DD of an embodiment. FIG. 4 is a cross-sectional view of a light emitting diode ED of an embodiment, and FIG. 5 is a cross-sectional view showing a part of a light emitting diode ED according to an embodiment.

In an embodiment, an electronic device EA may be a large-sized electronic device such as a television, a monitor and an external advertising board, but the present disclosure is not limited thereto. In addition, the electronic device EA may be a small and medium-sized electronic device such as a personal computer, a notebook computer, a personal digital terminal, a car navigation unit, a game console, a smartphone, a tablet and a camera, but the present disclosure is not limited thereto. In addition, these are suggested only for illustration, and other electronic devices may be employed if they do not deviate from the spirit of the present disclosure. In the described embodiments, a smartphone is shown as an embodiment of the electronic device EA, but the present disclosure is not limited thereto.

The electronic device EA may include a display device DD and a housing HAU. The display device DD may display an image IM through a display surface IS. FIG. 1 shows that the display surface IS is parallel to (e.g., substantially parallel to) a surface defined by a first direction DR1 and a second direction DR2 which crosses the first direction DR1. However, this is an illustration, and in another embodiment, the display surface IS of the display device DD may have a bent shape, or may be sufficiently flexible such that the shape may change.

The normal line of the display surface IS, that is, a direction displaying an image IM among the thickness directions of the display device DD is indicated by a third direction DR3. The front surface (or top surface) and rear surface (or bottom surface) of each member may be divided by the third direction DR3.

A fourth direction DR4 (FIG. 11) may be a direction between the first direction DR1 and the second direction DR2. The fourth direction DR4 may be positioned on a plane which is parallel to (e.g., substantially parallel to) a surface defined by the first direction DR1 and the second direction DR2. Meanwhile, the directions indicated by the first to fourth directions DR1, DR2, DR3 and DR4 are relative concepts and may be changed to other directions.

In the electronic device EA, the display surface IS displaying the image IM may correspond to the front surface of the display device DD and may correspond to the front surface FS of a window WP. Hereinafter, the same reference symbol will be used for the display surface and the front surface of the electronic device EA, and the front surface of the window WP. The image IM may include a still image as well as a dynamic image. Meanwhile, the electronic device EA may include a foldable display device including a folding area and a non-folding area, or a bending display device including at least one bending part.

The housing HAU may hold the display device DD. The housing HAU may cover the display device DD so as to expose the top surface of the display surface IS of the display device DD. The housing HAU covers the side surface and the bottom surface of the display device DD and may expose the entire top surface thereof. However, an embodiment of the present disclosure is not limited thereto, and the housing HAU may cover a part of the top surface as well as the side surface and the bottom surface of the display device DD.

In the electronic device EA of an embodiment, the window WP may include an optically transparent insulating material. The window WP may include a transmission area TA and a bezel area BZA. The front surface FS of the window WP including the transmission area TA and the bezel area BZA corresponds to the front surface FS of the electronic device EA. A user may see images provided through the transmission area TA which corresponds to the front surface FS of the electronic device EA.

In FIG. 1 and FIG. 2, the transmission area TA is shown that the apexes thereof have a round square shape. However, this shape is only an embodiment, and the transmission area TA may have various suitable shapes and is not limited to one embodiment.

The transmission area TA may be an optically transparent area (e.g., an area that transmits visible light). The bezel area BZA may be an area having a relatively lower transmission ratio when compared with the transmission area TA. The bezel area BZA may have a certain color. The bezel area BZA is adjacent to the transmission area TA and may surround the transmission area TA. The bezel area BZA may define the shape of the transmission area TA. However, an embodiment of the present disclosure is not limited thereto, and the bezel area BZA may be adjacent to only one side of the transmission area TA, or a part thereof may be omitted.

The display device DD may be below the window WP. In the description, the term "below" may mean an opposite direction to a direction providing images by the display device DD, but the present disclosure is not limited thereto.

In an embodiment, the display device DD may have a configuration substantially producing images IM. In the display device DD, the images IM thus produced are displayed on the display surface IS and seen through the transmission area TA by an external user. The display device DD includes a display area DA and a non-display area NDA. The display area DA may be an area activated by electrical signals. The non-display area NDA may be an area covered by the bezel area BZA. The non-display area NDA is adjacent to the display area DA. The non-display area NDA may surround the display area DA.

The display device DD may include a display panel DP and a light controlling layer PP on the display panel DP. The display panel DP may include a display device layer DP-EL. The display device layer DP-EL includes a light emitting diode ED.

The display device DD may include a plurality of light emitting diodes ED-1, ED-2 and ED-3. The light controlling layer PP may be on the display panel DP and control reflected light from the display panel DP by external light. The light controlling layer PP may include, for example, a polarization layer or a color filter layer.

In the display device DD of an embodiment, the display panel DP may be an emission type display panel. For example, the display panel DP may be a quantum dot emitting display panel including a quantum dot light emitting diode. However, an embodiment of the present disclosure is not limited thereto.

The display panel DP may include a base substrate BS, a circuit layer DP-CL on the base substrate BS, and a display device layer DP-EL on the circuit layer DP-CL.

The base substrate BS may be a member that provides a base surface where the display device layer DP-EL is located. The base substrate BS may be a glass substrate, a metal substrate, a plastic substrate, etc. However, an embodiment of the present disclosure is not limited thereto, and the base substrate BS may be an inorganic layer, an organic layer, or a composite material layer. The base substrate BS may be a flexible substrate which may be easily bent or folded.

In an embodiment, the circuit layer DP-CL may be on the base substrate BS, and the circuit layer DP-CL may include a plurality of transistors. The transistors each may include a control electrode, an input electrode, and an output electrode. For example, the circuit layer DP-CL may include a switching transistor and a driving transistor for driving the light emitting diode ED of the display device layer DP-EL.

FIG. 4 is a diagram showing a light emitting diode ED according to an embodiment, and referring to FIG. 4, the light emitting diode ED according to an embodiment includes a first electrode EL1, a second electrode EL2 opposite to the first electrode EL1, and a plurality of functional layers between the first electrode ED and the second electrode EL2 and including an emission layer EML.

The plurality of the functional layers may include a hole transport region HTR between the first electrode EL1 and the emission layer EML, and an electron transport region ETR between the emission layer EML and the second electrode EL2. Meanwhile, a capping layer may be further on the second electrode EL2 in an embodiment.

The hole transport region HTR and the electron transport region ETR may each include a plurality of sub functional layers. For example, the hole transport region HTR may include a hole injection layer HIL and a hole transport layer HTL as the sub functional layers, and the electron transport region ETR may include an electron injection layer EIL and an electron transport layer ETL as the sub functional layers. Meanwhile, an embodiment of the present disclosure is not limited thereto, but the hole transport region HTR may further include an electron blocking layer, etc., as the sub functional layers, and the electron transport region ETR may further include a hole blocking layer as the sub functional layer.

In the light emitting diode ED according to an embodiment, the first electrode EL1 has conductivity (e.g., electrical conductivity). The first electrode EL1 may be formed using a metal alloy or a conductive compound. The first electrode ED may be an anode. The first electrode EL1 may be a pixel electrode.

In the light emitting diode ED according to an embodiment, the first electrode EL1 may be a reflective electrode. However, an embodiment of the present disclosure is not limited thereto. For example, the first electrode EL1 may be a transmissive electrode or a transflective electrode. If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a multilayered structure including a reflective layer or a transflective layer formed using the above-described materials, and a transparent conductive layer formed using indium tin oxide (ITO), indium zinc oxide (IZO), zinc oxide (ZnO), indium tin zinc oxide (ITZO), etc. For example, the first electrode EL1 may be a multilayered metal layer and may have a stacked structure of metal layers of ITO/Ag/ITO, but the present disclosure is not limited thereto.

The hole transport region HTR is provided on the first electrode EL1. The hole transport region HTR may include a hole injection layer HIL, a hole transport layer HTL, etc. In addition, the hole transport region HTR may further include at least one of a hole buffer layer and an electron blocking layer in addition to the hole injection layer HIL and the hole transport layer HTL. The hole buffer layer may compensate an optical resonance distance according to the wavelength of light emitted from the emission layer EML and may increase light emission efficiency. Materials which may be included in the hole transport region HTR may be used as materials included in the hole buffer layer. The electron blocking layer is a layer that blocks or reduces the injection of electrons from the electron transport region ETR to the hole transport region HTR.

The hole transport region HTR may have a single layer formed using a single material, a single layer formed using a plurality of different materials, or a multilayer structure including a plurality of layers formed using a plurality of different materials. For example, the hole transport region HTR may have a structure of a single layer formed using a plurality of different materials or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, hole injection layer HIL/hole transport layer HTL/electron blocking layer, or the like. However, an embodiment of the present disclosure is not limited thereto.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound such as copper phthalocyanine, N,N'-diphenyl-N,N'-bis[4-(di-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, and/or dipyrazino[2,3-f: 2',3'-h] quinoxaline-2,3,6,7,10,11-hexacarbonitrile (HAT-CN).

The hole transport layer HTL may include, for example, carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris (N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis(N-carbazolyl)benzene (mCP), and/or the like.

The emission layer EML is on the hole transport region HTR. In the light emitting diode ED of an embodiment, the emission layer EML may include a quantum dot composite QD-C. The quantum dot composite QD-C included in the emission layer EML may be a quantum dot QD which is combined with (e.g., bonded to) a ligand LD at the surface of the quantum dot. As used herein, the terms "bonded to" and "combined with" may refer to a physical bond or a chemical bond (e.g., an ionic bond, a covalent bond, or a coordinate covalent bond), but the present disclosure is not limited thereto. The quantum dot composite QD-C includes a ligand LD which is combined with (e.g., bonded to) the surface thereof to improve the dispersibility and capping properties of the quantum dot OD while maintaining charge injection properties, and may have modified surface properties.

In the light emitting diode ED of an embodiment, the emission layer EML may be formed from the quantum dot composition of an embodiment.

The emission layer EML includes a plurality of quantum dot composites QD-C. The quantum dot composites QD-C included in the emission layer EML may be stacked to form a layer. In FIG. 4, illustrated are approximately two layers formed by arranging the quantum dot composites QD-C which form, for example, a circular cross-section. However, an embodiment of the present disclosure is not limited thereto. For example, the arrangement of the quantum dot composites QD-C may be changed according to the thickness of the emission layer EML, the shape of the quantum dot QD included in the emission layer EML, an average diameter of the quantum dots OD, the kind of a ligand LD connected to the quantum dots OD, etc. For example, in the emission layer EML, the quantum dot composites QD-C may be arranged in neighboring relation to form one layer or may be arranged to form a plurality of layers including two layers, three layers, or the like.

The emission layer EML may have a thickness of, for example, about 5 nm to about 20 nm, or about 10 nm to about 20 nm.

In the light emitting diode ED of an embodiment, the quantum dot composite QD-C included in the emission layer EML may be a surface modified one of the quantum dot QD. The quantum dot QD included in the emission layer EML of an embodiment may be a semiconductor nanocrystal which may be selected from a group II-VI compound, a group III-V compound, a group IV-VI compound, a group IV element, a group IV compound, and combinations thereof.

The group II-VI compound may be selected from the group consisting of a binary compound selected from the group consisting of CdS, CdSe, CdTe, ZnS, ZnSe, ZnTe, ZnO, HgS, HgSe, HgTe, MgSe, MgS, and a mixture thereof, a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, GaAlNP, and a mixture thereof.

The group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

In this case, the binary compound, the ternary compound or the quaternary compound may be present at uniform (e.g., substantially uniform) concentration in a particle or may be present at a partially different concentration distribution state in the same particle. In addition, a core-shell structure in which one quantum dot wraps (at least partially surrounds, or completely surrounds) another quantum dot may be possible. The interface of the core and the shell may have a concentration gradient in which the concentration of an element present in the shell is decreased toward a center of the core.

In some embodiments, the quantum dot QD may have a core-shell structure including a core CR including the above-described nanocrystal and a shell SL wrapping the core CR. The shell SL of the quantum dot QD having the core-shell structure may be a protection layer for preventing or reducing the chemical deformation of the core CR to maintain semiconductor properties and/or a charging layer for imparting the quantum dot QD with electrophoretic properties. The shell SL may have a single layer or a multilayer. The interface of the core CR and the shell SL may have a concentration gradient in which the concentration of an element present in the shell SL is decreased toward a center. Examples of the shell SL of the quantum dot OD having the core-shell structure may include a metal or non-metal oxide, a semiconductor compound, or the combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a ternary compound such as $MgAl_2O_4$, $CoFe_2O_4$, $NiFe_2O_4$ and $CoMn_2O_4$, but an embodiment of the present disclosure is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the present disclosure is not limited thereto.

The quantum dot QD may have a full width of half maximum (FWHM) of emission wavelength spectrum of about 44 nm or less, for example, about 40 nm or less, or, about 30 nm or less. Within this range, color purity or color reproducibility may be improved. In addition, light emitted through such quantum dot QD is emitted in all directions, and light view angle properties may be improved.

In addition, the shape of the quantum dot QD may have generally used shapes in the art, without specific limitation. In some embodiments, the shape of spherical, pyramidal, multi-arm, or cubic nanoparticle, nanotube, nanowire, nanofiber, nanoplate particle, etc. may be used.

The quantum dot QD may control the color of emitted light according to the particle size, and accordingly, the quantum dot QD may have various suitable emission colors such as blue, red and green. With the decrease of the particle size of the quantum dot QD, light in a short wavelength region may be emitted. For example, in the quantum dots QD having the same core, the particle size of the quantum dot emitting green light may be smaller than the particle size of the quantum dot emitting red light. In addition, in the quantum dots QD having the same core, the particle size of the quantum dot emitting blue light may be smaller than the particle size of the quantum dot emitting green light. However, an embodiment of the present disclosure is not limited thereto, and the particle size may be controlled according to the forming material of a shell and the thickness of a shell in the quantum dots QD having the same core.

Meanwhile, in case where the quantum dots QD have diverse emitting colors including blue, red, green, etc., quantum dots QD having different emitting colors may have different core materials from each other.

In addition, in the light emitting diode ED of an embodiment, the emission layer EML may include a host and a dopant. In an embodiment, the emission layer EML may include the quantum dot QD as a dopant material. In addition, in an embodiment, the emission layer EML may further include a host material.

Meanwhile, in the light emitting diode ED of an embodiment, the emission layer EML may emit fluorescence. For example, the quantum dot QD may be used as a fluorescence dopant material.

The emission layer EML may be formed using various suitable methods such as a vacuum deposition method, a spin coating method, a cast method, a Langmuir-Blodgett (LB) method, an inkjet printing method, a laser printing method, and a laser induced thermal imaging (LITI) method. For example, the emission layer EML may be formed by providing a quantum dot composition of an embodiment by an ink jet printing method.

In the light emitting diode ED of an embodiment, the electron transport region ETR is provided on the emission layer EML. The electron transport region ETR may include at least one of a hole blocking layer, an electron transport layer ETL and an electron injection layer EIL. However, an embodiment of the present disclosure is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or may have a structure of a single layer formed using an electron injection material and an electron transport material. In addition, the electron transport region ETR may have a single layer structure formed using a plurality of different materials, or a structure stacked from the emission layer EML of electron transport layer ETL/electron injection layer EIL, or hole blocking layer/electron transport layer ETL/electron injection layer EIL, without limitation. The thickness of the electron transport region ETR may be, for example, from about 200 Å to about 1,500 Å.

The electron transport region ETR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. However an embodiment of the present disclosure is not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthrancene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), or a mixture thereof. The thickness of the electron transport layer ETL may be from about 100 Å to about 1,000 Å and may be, for example, from about 150 Å to about 500 Å. If the thickness of the electron transport layer ETL satisfies the above-described range, suitable or satisfactory electron transport properties may be obtained without substantial increase of a driving voltage.

If the electron transport region ETR includes the electron injection layer EIL, the electron transport region ETR may include a metal halide, a metal in lanthanides, or a co-deposited material of the metal halide and the metal in lanthanides. Meanwhile, the metal halide may be an alkali metal halide. For example, the electron transport region ETR may include LiF, hydroxyquinolinato-lithium (Liq), $Li_2O$, BaO, NaCl, CsF, Yb, RbCI, Rbl, KI, KI:Yb etc. However, an embodiment of the present disclosure is not limited thereto. The electron injection layer EIL may also be formed using a mixture material of an electron transport material and an insulating organo metal salt. For example, the organo metal salt may include metal acetates, metal benzoates, metal acetoacetates, metal acetylacetonates, or metal stearates. The thickness of the electron injection layer EIL may be from about 1 Å to about 100 Å, and from about 3 Å to about 90 Å. If the thickness of the electron injection layer EIL satisfies the above described range, suitable or satisfactory electron injection properties may be obtained without inducing substantial increase of a driving voltage.

The electron transport region ETR may include a hole blocking layer as described herein above. The hole blocking layer may include, for example, at least one of 2,9-dimethyl-4,7-diphenyl-1,10-phenanthroline (BCP), and 4,7-diphenyl-1,10-phenanthroline (Bphen). However, an embodiment of the present disclosure is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may be formed using a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof, or a mixture thereof (for example, a mixture of Ag and Mg). In some embodiments, the second electrode EL2 may have a multilayered structure including a reflective layer or a transflective layer formed using the above-described materials, and a transparent conductive layer formed using ITO, IZO, ZnO, ITZO, etc. In an embodiment, the second electrode EL2 may include AgMg. In some embodiments, the second electrode EL2 may include AgYb. However, an embodiment of the present disclosure is not limited thereto.

In some embodiments, the second electrode EL2 may be coupled with an auxiliary electrode. If the second electrode EL2 is coupled with the auxiliary electrode, the resistance of the second electrode EL2 may be decreased.

Figure 6:
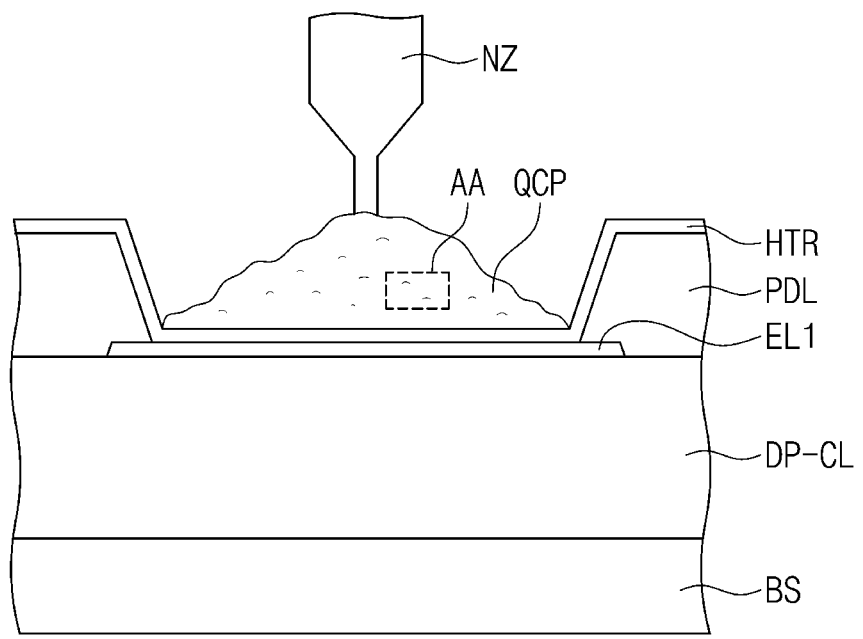
FIG. 6 is a cross-sectional view schematically showing a step of forming an emission layer in a method for manufacturing a light emitting diode of an embodiment.

FIG. 6 is a view schematically showing a step of forming an emission layer in a method for manufacturing a light emitting diode of an embodiment. The step of forming an emission layer may include a step of providing a quantum dot composition QCP on a hole transport region HTR. The quantum dot composition QCP may be provided through a nozzle NZ in between a pixel defining layer PDL.

Figure 7:
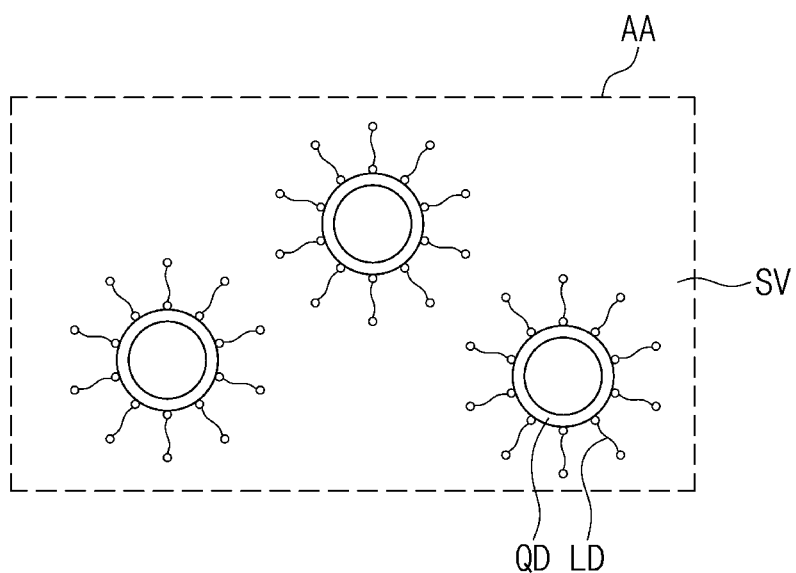
FIG. 7 is a cross-sectional view showing a part of the quantum dot composition provided in FIG. 6 in more detail.
Figure 8:
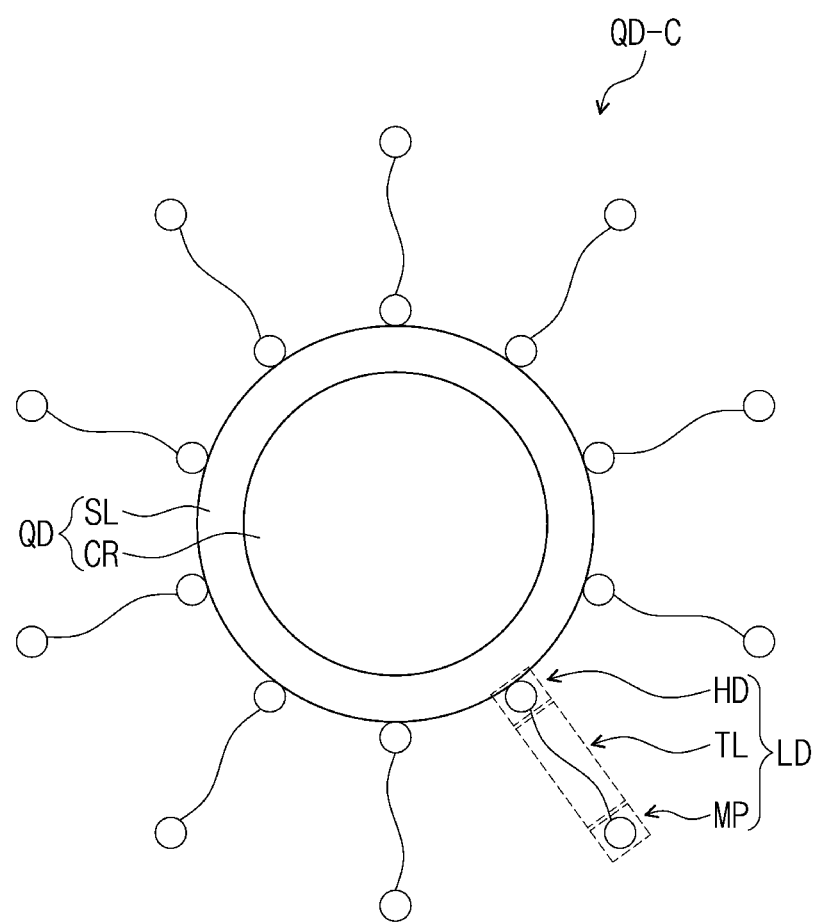
FIG. 8 is a schematic diagram of a quantum dot composite of an embodiment.
Figure 9:
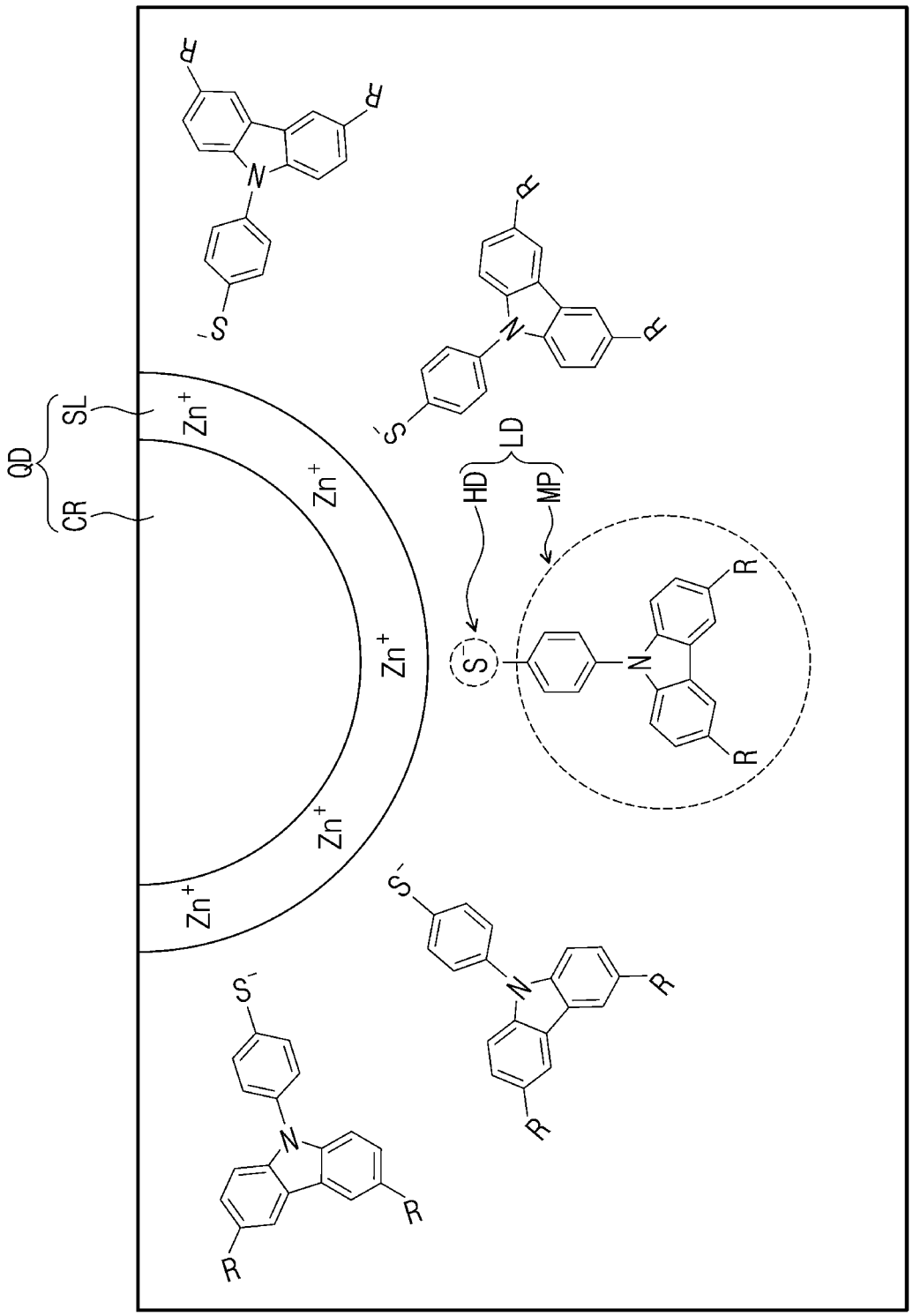
FIG. 9 is a schematic diagram showing the combination relation of a quantum dot and a ligand structure in a quantum dot composition of an embodiment.

FIG. 7 is a diagram showing a part (area "AA") of the quantum dot composition QCP provided in FIG. 6 in more detail. FIG. 8 is a diagram schematically showing a quantum dot composite QD-C including a quantum dot QD and a ligand LD structure which is combined with (e.g., bonded to) the surface of the quantum dot QD. FIG. 9 is a diagram schematically showing the combination relation of a quantum dot QD and a ligand LD structure combined with (e.g., bonded to) the surface of the quantum dot QD in a quantum dot composition QCP.

Referring to FIG. 6 to FIG. 8, the quantum dot composition QCP of an embodiment may include a quantum dot QD, and a ligand LD combined with (e.g., bonded to) the surface of the quantum dot QD. The quantum dot composition QCP may further include an organic solvent SV in which the quantum dot QD and the ligand LD are dispersed. For example, the organic solvent SV may include hexane, toluene, chloroform, dimethyl sulfoxide, or dimethyl formamide. However, an embodiment of the present disclosure is not limited thereto.

The quantum dot QD may be dispersed in the organic solvent SV and provided. According to the combination of the ligand LD with the surface of the quantum dot QD, the dispersibility of the quantum dot composites QD-C in the organic solvent SV may increase. In the step of forming an emission layer, a step of vaporizing the organic solvent SV may be further included after the step of providing the quantum dot composition QCP.

As described herein above, the quantum dot QD may include a core CR and a shell SL wrapping (e.g., at least partially surrounding, or completely surrounding) the core CR. However, an embodiment of the present disclosure is not limited thereto, but the quantum dot QD may have a single layer structure or a plurality of shells. Meanwhile, for the quantum dots QD included in the quantum dot composition QCP of an embodiment, the same explanation on the quantum dots QD explained in the light emitting diode ED of an embodiment referring to FIG. 4 and FIG. 5, may be applied.

The ligand LD may include a head part HD which is combined with (e.g., bonded to) the surface of the quantum dot QD, and a body part MP. The body part MP of the ligand LD may have a charge transport moiety. The ligand LD may further include a chain part TL connecting the head part HD and the body part MP.

The body part MP of the ligand LD may have a hole transport moiety, or an electron transport moiety. For example, the body part MP may include a N-phenyl carbazole group having hole transport properties. Otherwise, the body part MP may include a triphenyl triazine group having electron transport properties.

The body part MP may be represented by the following Formula 1-1 or Formula 1-2:

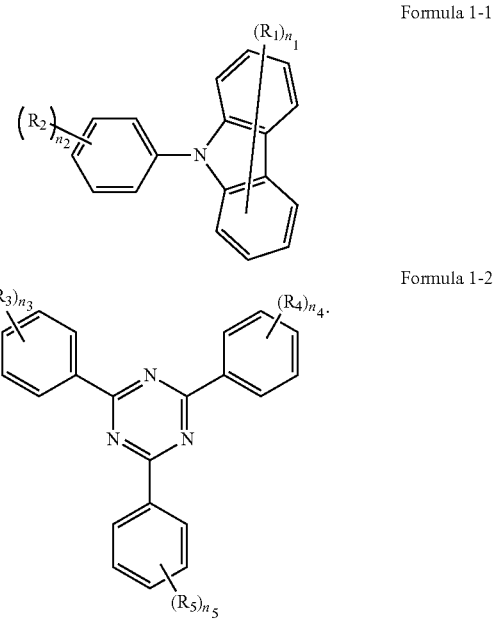

In Formula 1-1 and Formula 1-2, $R_1$ to $R_5$ may be each independently a hydrogen atom, a deuterium atom, a halogen atom, a substituted or unsubstituted alkyl group of 1 to 20 carbon atoms, a substituted or unsubstituted aryl group of 6 to 60 carbon atoms for forming a ring, or a substituted or unsubstituted heteroaryl group of 2 to 60 carbon atoms for forming a ring. All $R_1$ to $R_5$ may be, for example, hydrogen atoms.

$n_1$ may be an integer of 0 to 8. In Formula 1-1, if $n_1$ is 0, the body part MP of an embodiment may not be substituted with $R_1$. A case where $n_1$ is an integer of 2 or more and all $R_1$ groups are hydrogen atoms in Formula 1-1 may be the same as a case where $n_1$ is 0 in Formula 1-1. In Formula 1-1, if $n_1$ is an integer of 2 or more, a plurality of $R_1$ groups may be the same or different from each other.

$n_2$ to $n_5$ may be each independently an integer of 0 to 5. In Formula 1-1 and Formula 1-2, if $n_2$ to $n_5$ are 0, the body part MP of an embodiment may not be substituted with $R_2$ to $R_5$. A case where $n_2$ to $n_5$ are each independently an integer of 2 or more and all $R_2$ to $R_5$ are hydrogen atoms in Formula 1-1 and Formula 1-2 may be the same as a case where $n_2$ to $n_5$ are 0 in Formula 1-1 and Formula 1-2. In Formula 1-1 and Formula 1-2, if $n_2$ to $n_5$ are each independently an integer of 2 or more, a plurality of $R_2$ to $R_5$ may be each independently the same or at least one among a plurality of $R_2$ to $R_5$ may be different.

If the body part MP is represented by Formula 1-1, at least one among $R_1$ and $R_2$ may be a part connected with the head part HD or the chain part TL. If the body part MP is represented by Formula 1-2, at least one among $R_3$ to $R_5$ may be a part connected with the head part HD or the chain part TL.

Referring to the above-described FIG. 4 and FIG. 8 together, if the quantum dot composite QD-C according to an embodiment is applied to a light emitting diode ED, the body part MP may have the same moiety as a material included in a layer adjacent to the emission layer EML in which the quantum dot composite QD-C is included (e.g., the body part MP may have a moiety having a same composition as a material included in the adjacent layer). In an embodiment, the hole transport region HTR may include a first hole transport material, and the body part MP may have the same moiety as the first hole transport material (e.g., the body part MP and the first hole transport material may each include a moiety having the same composition as each other). For example, in a hole transport layer HTL which is adjacent to the emission layer EML in the hole transport region HTR, the first hole transport material including a N-phenyl carbazole group may be included, and the body part MP may also include the N-phenyl carbazole group. In an embodiment, the electron transport region ETR may include a first electron transport material, and the body part MP may have the same moiety as the first electron transport material (e.g., the body part MP and the first electron transport material may each include a moiety having a same composition as each other). For example, in an electron transport layer ETL which is adjacent to the emission layer EML in the electron transport region ETR, the first electron transport material including a triphenyl triazine group may be included, and the body part MP may also include the triphenyl triazine group.

As used herein, the term "substituted or unsubstituted" may mean substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may be substituted or unsubstituted. For example, a biphenyl group may be interpreted as an aryl group or a phenyl group substituted with a phenyl group.

The head part HD of the ligand LD is a part combining with the surface of the quantum dot QD and may include a functional group for the combination with the surface of the quantum dot QD. The head part HD may include at least one thiol group. The head part HD may include one thiol group, two thiol groups, or a dithioic acid group. If the head part HD includes one functional group for the combination with the surface of the quantum dot QD, the ligand LD may be a monodentate ligand. If the head part HD includes two functional groups for the combination with the surface of the quantum dot QD, the ligand LD may be a bidentate ligand. The head part HD may include a functional group for the combination with the surface of the shell SL of the quantum dot QD.

The chain part TL of the ligand LD may perform the function of connecting the head part HD and the body part MP and controlling the length of the ligand LD to control the dispersing degree of the quantum dot composites QD-C in the quantum dot composition QCP. The chain part TL may be, for example, a substituted or unsubstituted alkyl group, a substituted or unsubstituted amine group, a substituted or unsubstituted oxy group, a substituted or unsubstituted thio group, a substituted or unsubstituted ester group, or a substituted or unsubstituted amide group. The functional group included or the length of a chain in the chain part TL may be changed according to the kind of the organic solvent SV in which the quantum dot composites QD-C are dispersed. In an embodiment, the chain part TL may be omitted, and the head part HD of the ligand LD and the body part MP may have a direct linkage.

The ligand LD may include, for example, the structures represented by Formula 2-1 to Formula 2-3 below. However, an embodiment of the present disclosure is not limited thereto.

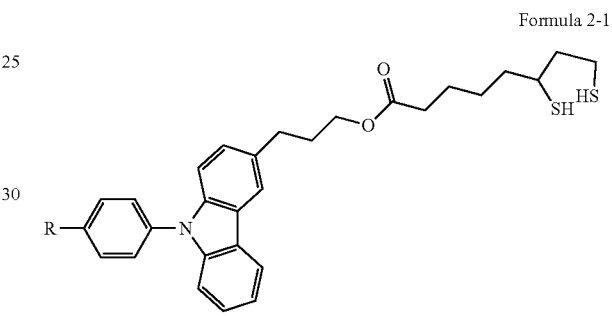

Formula 2-1

Formula 2-2

Formula 2-3

The ligand LD may include, for example, the structures represented by Formula 3-1 to Formula 3-3 below. However, an embodiment of the present disclosure is not limited thereto.

Formula 3-1
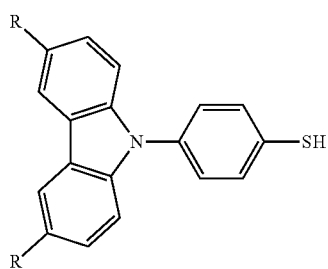
Formula 3-3
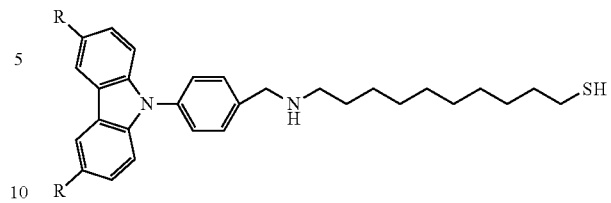
Formula 3-2
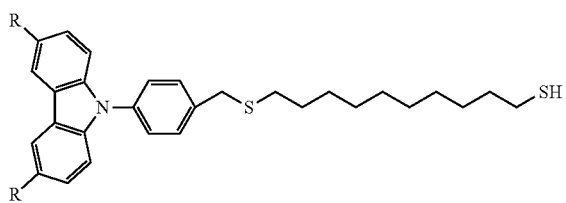
The ligand LD may include, for example, the structures represented by Formula 4-1 to Formula 4-5 below. However, an embodiment of the present disclosure is not limited thereto.
Formula 4-1
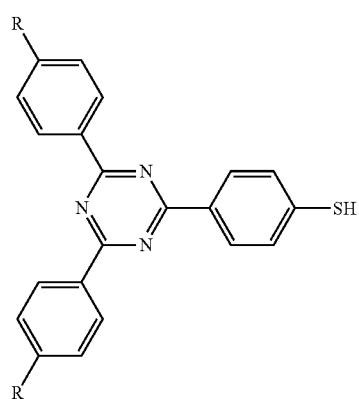
Formula 4-2
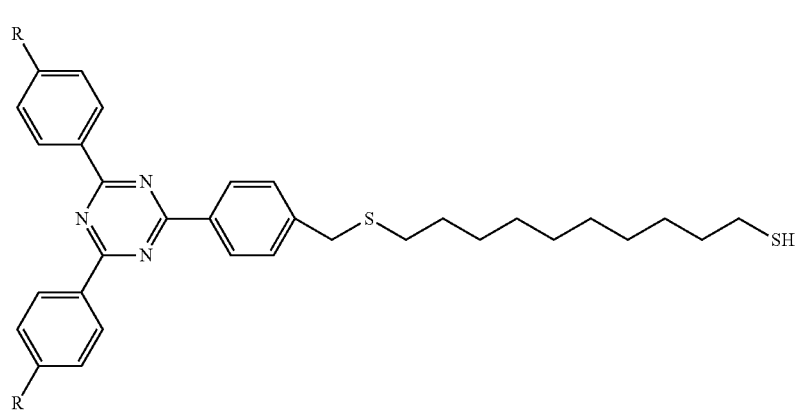

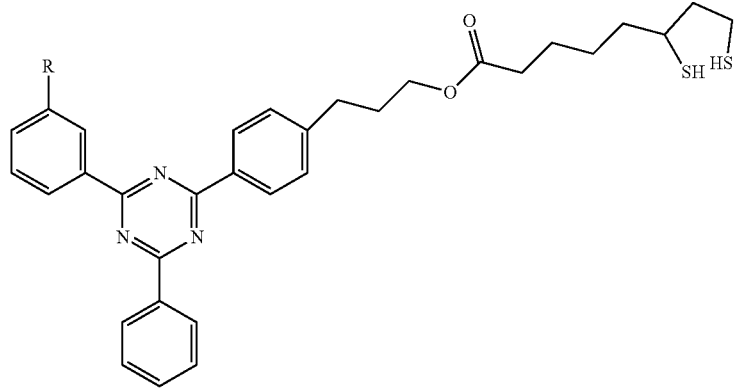

Formula 4-3

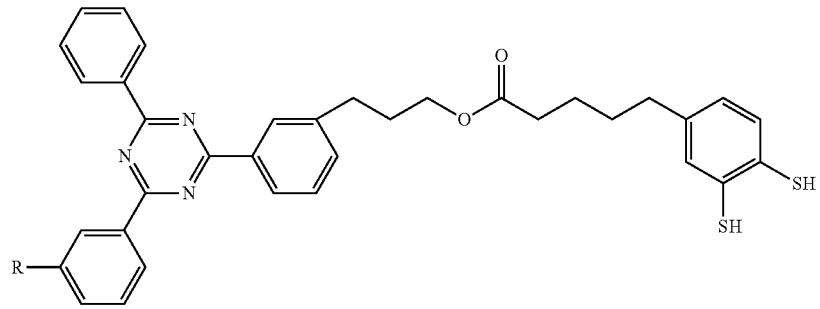

Formula 4-4

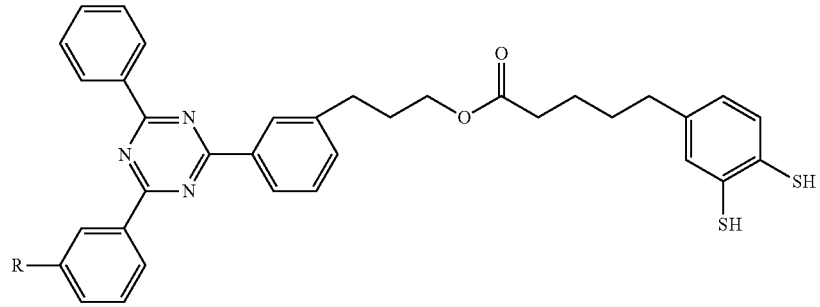

Formula 4-5

In Formula 2-1 to Formula 4-5, R may be a hydrogen atom, a deuterium atom, a halogen atom, a substituted or unsubstituted alkyl group of 1 to 20 carbon atoms, a substituted or unsubstituted aryl group of 6 to 60 carbon atoms for forming a ring, or a substituted or unsubstituted heteroaryl group of 2 to 60 carbon atoms for forming a ring.

FIG. 9 illustrates a quantum dot composite according to an embodiment wherein a ligand LD includes the structure represented by Formula 3-1 and a shell SL includes Zn. However, an embodiment of the present disclosure is not limited thereto.

Referring to FIG. 9, a quantum dot OD includes a core CR and a shell SL, and a ligand LD may be combined with (e.g., bonded to) the shell SL. For example, the head part HD of the ligand LD may include a thiol group, and a metal ion part included in the shell SL may be combined with (e.g., bonded to) the head part HD so that the ligand LD may be combined with (e.g., bonded to) the quantum dot QD.

The head part HD of the ligand LD may be combined with (e.g., bonded to) the surface of the quantum dot QD, and the body part MP may be exposed to the outside (e.g., the body part MP may be directed away from the surface of the quantum dot QD). As shown in FIG. 9, according to the combination of the head part HD including a thiol group with the surface of the quantum dot QD, the body part MP including a N-phenyl carbazole group having hole transport properties may be exposed to the outside of the quantum dot QD.

Because the quantum dot composite included in the quantum dot composition according to an embodiment of the present disclosure includes a ligand which is combined with (e.g., bonded to) the surface of a quantum dot and the ligand includes a body part having a charge transport moiety, the dispersibility and capping properties of the quantum dot composites in the quantum dot composition may be increased and excellent luminous efficiency may be achieved if applied to a light emitting diode.

If the ligand is combined with (e.g., bonded to) the surface of the quantum dot, the dispersibility and capping properties of the quantum dot composites of which surfaces are modified by the ligands in the quantum dot composition may be improved, but if applied to a light emitting diode, the ligand may inhibit or reduce charge injection properties and decrease the luminous efficiency of the light emitting diode. However, because the quantum dot composite included in the quantum dot composition according to an embodiment of the present disclosure includes a moiety having hole transport properties or electron transport properties in the main part of the ligand which is exposed to the outside of the quantum dot, though the quantum dot composite connected with the ligand is applied to a light emitting diode, the generation of the degradation of the charge injection properties may be prevented or reduced and accordingly, the luminous efficiency properties of a light emitting diode may be improved.

Hereinafter, the subject matter of the present disclosure will be explained in more detail referring to particular embodiments and comparative embodiments. However, the embodiments are only for illustrations to assist the understanding of the subject matter of the present disclosure, and the scope of the present disclosure is not limited thereto.

Calculation of Energy Levels According to Ligands

Highest Occupied Molecular Orbital (HOMO) energy levels and Lowest Unoccupied Molecular Orbital (LUMO) energy levels of the ligand structures of Example 1 and Example 2, including the structures according to exemplary embodiments of the present disclosure, and the ligand structures of Comparative Example 1 (oleic acid), Comparative Example 2 (1-dodecanethiol) and Comparative Example 3, were calculated and shown in Table 1. The ligand structures of Example 1 and Example 2, and the ligand structures of Comparative Example 3 are as follows.

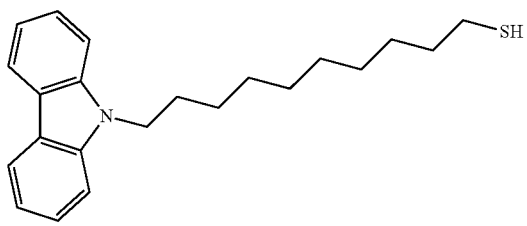

Comparative Example

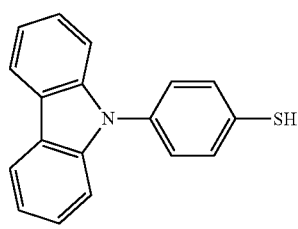

EXAMPLES

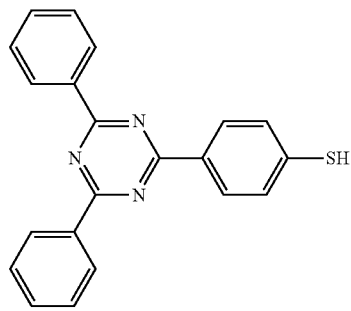

TABLE 1

|  | Example 1 | Example 2 | Comparative Example 1 | Comparative Example 2 | Comparative Example 3 |
| --- | --- | --- | --- | --- | --- |
| HOMO (eV) | −5.373 | −6.648 | −6.382 | −6.316 | −5.316 |
| LUMO (eV) | −0.708 | −1.924 | 0.293 | 0.804 | −0.627 |

Referring to Table 1, the ligand structures of Comparative Example 1, Comparative Example 2, and Comparative Example 3 have deep HOMO levels and high energy level differences between HOMO levels and LUMO levels, and if the ligand structure are applied to light emitting diodes, luminous efficiency should decrease. The ligand structures of Example 1 and Example 2 have improved HOMO levels and low energy level difference values between HOMO-LUMO, and if the ligand structures are applied to light emitting diodes, the effects of luminous efficiency should improve, the thickness increase of an emission layer including the quantum dot composite according to the increase of device efficiency may become possible, and the device life should be increased.

Calculation of Mobility Improving Effects According to Ligands

In case of applying the ligand structures of the above-described Example 1 and Example 2 and the ligand structure of Comparative Example 1 and Comparative Example 3 to quantum dot composites, a distance between quantum dot-quantum dot, and charge mobility were calculated and shown in Table 2 below.

TABLE 2

|  | Example 1 | Example 2 | Comparative Example 1 | Comparative Example 3 |
| --- | --- | --- | --- | --- |
| Distance between quantum dot-quantum dot (Å) | 28 | 17 | 34 | 17 |
| Charge mobility ($cm^2V^{-1}S^{-1}$) | $7.0 \times 10^{-6}$ | $1.0 \times 10^{-3}$ | $4.0 \times 10^{-7}$ | $1.0 \times 10^{-3}$ |

Figure 10A:
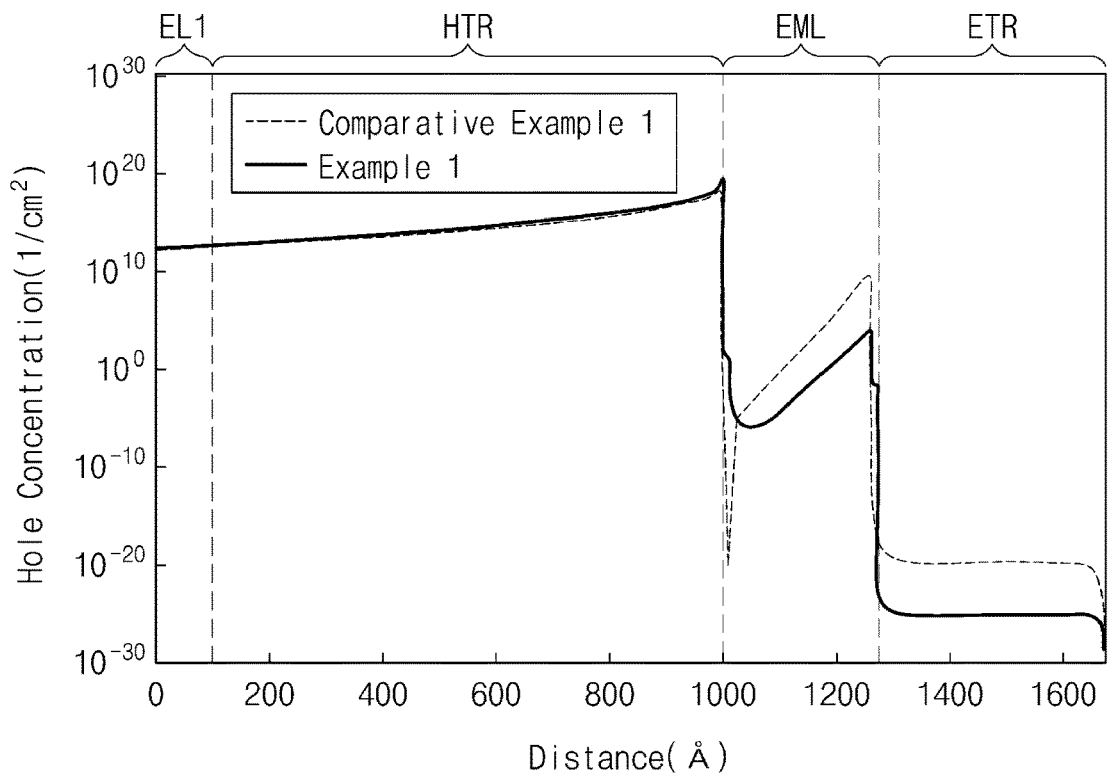
FIG. 10A is a graph showing simulation results on hole concentrations in all layers in a light emitting diode including a ligand structure of an embodiment and a light emitting diode including a ligand structure of a comparative embodiment.
Figure 10B:
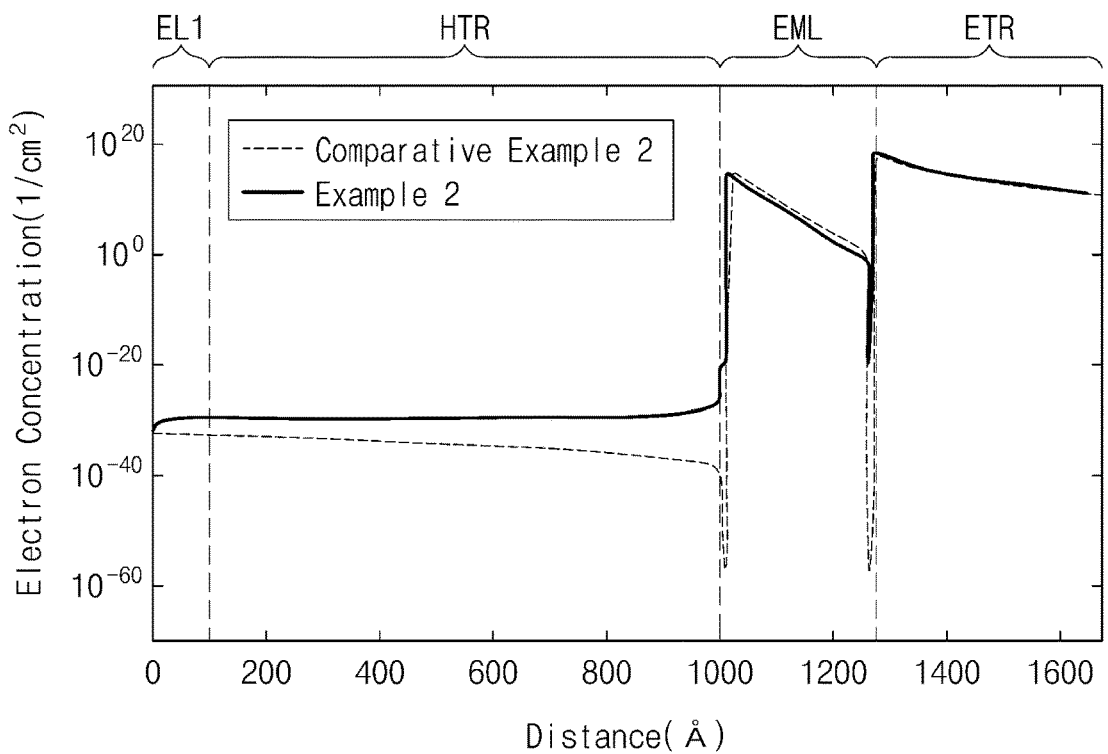
FIG. 10B is a graph showing simulation results on electron concentrations in all layers in a light emitting diode including a ligand structure of an embodiment and a light emitting diode including a ligand structure of a comparative example.

Referring to Table 2, the ligand structures of Example 1 and Example 2 may secure a shorter distance between quantum dot-quantum dot when compared with the ligand structures of Comparative Examples 1 and 3, and the quantum dot composite including the ligand structure of the Examples should have higher charge mobility than that of Comparative Examples 1 and 3. FIG. 10A is a graph showing simulation results on the hole concentrations in all layers for the light emitting diode including the ligand structure of Example 1 and the light emitting diode including the ligand structure of Comparative Example 1. FIG. 10B is a graph showing simulation results on the electron concentrations in all layers for the light emitting diode including the ligand structure of Example 2 and the light emitting diode including the ligand structure of Comparative Example 2. Referring to FIG. 10A and FIG. 10B, in the light emitting diode including the ligand structure of the Example, the HOMO level and LUMO level of the quantum dot composite in which the ligand is applied were improved, and the charge mobility of the emission layer including the quantum dot composite was improved, and the hole concentration and the electron concentration at the interface of the emission layer and the hole transport region and electron transport region were not reduced but maintained good. Through this, the light emitting diode in which the ligand structure according to an embodiment of the present disclosure is applied should provide improved luminous efficiency.

Figure 11:
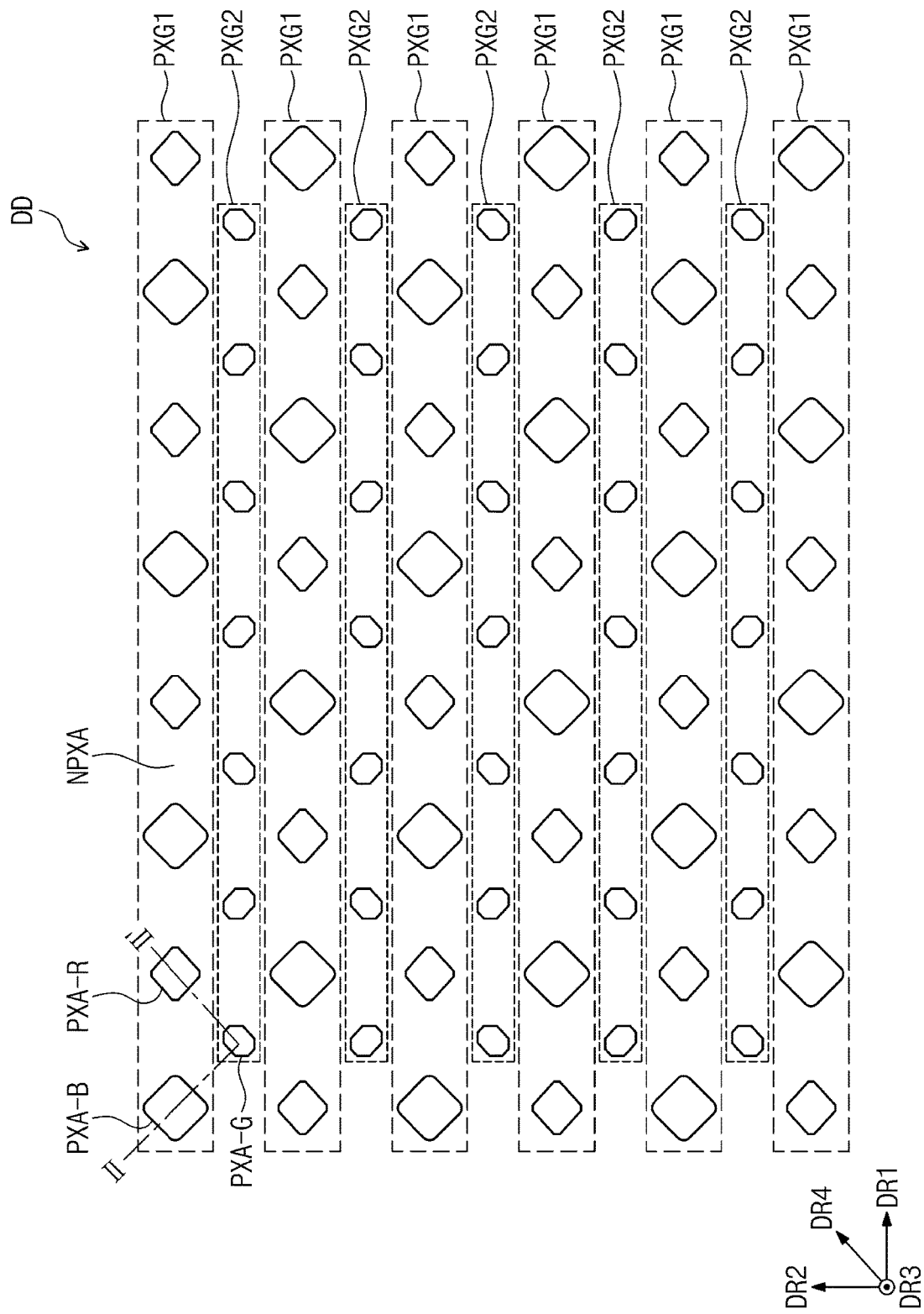
FIG. 11 is a plan view showing a display device of an embodiment.
Figure 12:
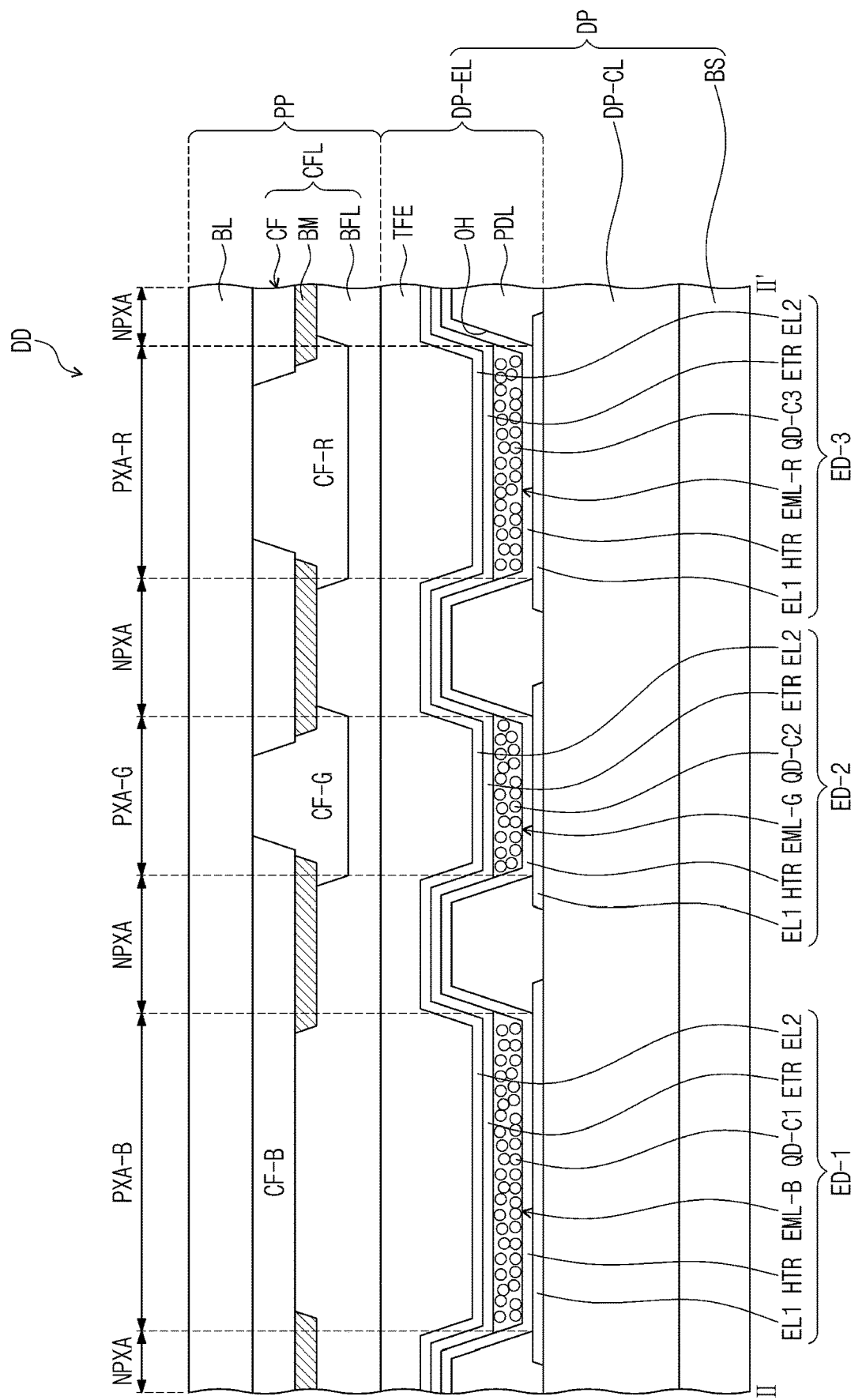
FIG. 12 is a cross-sectional view of a display device of an embodiment taken along line II-II' of FIG. 11.
Figure 13:
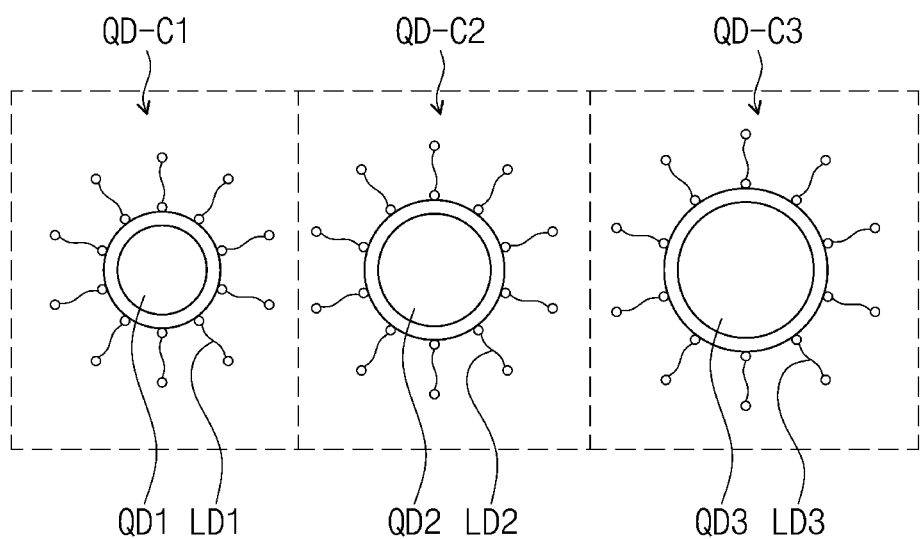
FIG. 13 is a schematic diagram of quantum dot composites included in a display device of an embodiment.

FIG. 11 is a plan view of a display device DD according to an embodiment. FIG. 12 is a cross-sectional view of a display device DD of an embodiment. FIG. 12 is a cross-sectional view corresponding to line II-II' in FIG. 11. FIG. 13 is a schematic diagram of quantum dot composites included in the display device DD of an embodiment.

The display device DD of an embodiment includes a plurality of light emitting diodes ED-1, ED-2 and ED-3, and the light emitting diodes ED-1, ED-2 and ED-3 may include emission layers EML-B, EML-G and EML-R including quantum dot composites QD-C1, QD-C2 and QD-C3.

In addition, the display device DD of an embodiment may include a display panel DP including a plurality of light emitting diodes ED-1, ED-2 and ED-3 and a light controlling layer PP on the display panel DP. Meanwhile, different from the diagram shown in the drawings, the light controlling layer PP may be omitted in the display device DD of an embodiment.

The display panel DP includes a base substrate BS, a circuit layer DP-CL provided on the base substrate BS, and a display device layer DP-EL, and the display device layer DP-EL may include a pixel defining layer PDL, light emitting diodes ED-1, ED-2 and ED-3 between the pixel defining layer PDL, and a sealing layer TFE on the light emitting diodes ED-1, ED-2 and ED-3.

Referring to FIG. 11 and FIG. 12, the display device DD may include a non-emission region NPXA and emission regions PXA-B, PXA-G and PXA-R. The emission regions PXA-B, PXA-G and PXA-R may be regions to emit light produced from the light emitting diodes ED-1, ED-2 and ED-3, respectively. The emission regions PXA-B, PXA-G and PXA-R may be separated from each other on a plane.

The emission regions PXA-B, PXA-G and PXA-R may be divided into a plurality of groups according to the color of light produced from the light emitting diodes ED-1, ED-2 and ED-3. In the display device DD of an embodiment shown in FIG. 11 and FIG. 12, three emission regions PXA-B, PXA-G and PXA-R to respectively emit blue light, green light and red light are shown for illustration. For example, the display device DD of an embodiment may include a blue emission region PXA-B, a green emission region PXA-G and a red emission region PXA-R, which are distinguished from each other.

A plurality of light emitting diodes ED-1, ED-2 and ED-3 may emit lights in different wavelength regions. For example, in an embodiment, the display device DD may include a first light emitting diode ED-1 emitting blue light, a second light emitting diode ED-2 emitting green light, and a third light emitting diode ED-3 emitting red light. However, an embodiment of the present disclosure is not limited thereto, and the first to third light emitting diodes ED-1, ED-2 and ED-3 may emit light in the same wavelength region, or at least one thereof may emit light in a different wavelength region.

For example, the blue emission region PXA-B, the green emission region PXA-G, and the red emission region PXA-R of the display device DD may correspond to the first light emitting diode ED-1, the second light emitting diode ED-2, and the third light emitting diode ED-3, respectively.

The first emission layer EML-B of the first light emitting diode ED-1 may include a first quantum dot composite QD-C1. The first quantum dot composite QD-C1 may emit blue light which is the first color light.

The second emission layer EML-G of the second light emitting diode ED-2 and the third emission layer EML-R of the third light emitting diode ED-3 may include a second quantum dot composite QD-C2 and a third quantum dot composite QD-C3, respectively. The second quantum dot composite QD-C2 and the third quantum dot composite QD-C3 may emit green light which is the second color light, and red light which is the third color light, respectively.

The first to third quantum dot composites QD-C1, QD-C2 and QD-C3 may have quantum dots QD1, QD2 and QD3 and ligands LD1, LD2 and LD3 combined with (e.g., bonded to) the surfaces of the quantum dots QD1, QD2 and QD3, respectively. For example, in an embodiment, a first quantum dot QD1 and a first ligand LD1 may be included in the first quantum dot composite QD-C1, a second quantum dot QD2 and a second ligand LD2 may be included in the second quantum dot composite QD-C2, and a third quantum dot QD3 and a third ligand LD3 may be included in the third quantum dot composite QD-C3. The same explanation referring to the quantum dot composite QD-C in the light emitting diode of an embodiment may be applied to each of the first to third quantum dot composites QD-C1, QD-C2 and QD-C3.

In an embodiment, the first to third quantum dots QD1, QD2 and QD3 of the first to third quantum dot composites QD-C1, QD-C2 and QD-C3, included in the light emitting diodes ED-1, ED-2 and ED-3 may be formed using different core materials from each other. In some embodiments, the first to third quantum dots QD1, QD2 and QD3 of the first to third quantum dot composites QD-C1, QD-C2 and QD-C3 may be formed using the same core material, or two quantum dots selected among the first to third quantum dots QD1, QD2 and QD3 of the first to third quantum dot composites QD-C1, QD-C2 and QD-C3 may be formed using the same core material and the remainder may be formed using a different core material.

In an embodiment, the first to third quantum dots QD1, QD2 and QD3 of the first to third quantum dot composites QD-C1, QD-C2 and QD-C3 may have different diameters from each other. For example, the first quantum dot QD1 used in the first light emitting diode ED-1 which emits light in a relatively short wavelength region may have a relatively smaller average diameter when compared with the second quantum dot QD2 of the second light emitting diode ED-2 and the third quantum dot QD3 of the third light emitting diode ED-3, which emit light in a relatively long wavelength region.

Meanwhile, in the present disclosure, the average diameter corresponds to an arithmetical mean value of the diameters of a plurality of quantum dot particles. As described herein, the diameter of the quantum dot particle may be the mean value of the widths of the quantum dot particles in a cross-section.

The relation on the average diameter of the first to third quantum dots QD1, QD2 and QD3 is not limited to the above-defined details. For example, FIG. 13 shows that the first to third quantum dots QD1, QD2 and QD3, have different sizes, but different from the illustration, the sizes of the first to third quantum dots QD1, QD2 and QD3 included in the light emitting diodes ED-1, ED-2 and ED-3 may be similar. In addition, the average diameter of two quantum dots selected among the first to third quantum dots QD1, QD2 and QD3 may be similar and the remainder may have a different average diameter.

In an embodiment, the first to third ligands LD1, LD2 and LD3 of the first to third quantum dot composites QD-C1, QD-C2 and QD-C3 may be the same or different from each other. The first to third ligands LD1, LD2 and LD3 may be appropriately selected according to the light emitting wavelength, etc. of the light emitting diodes ED-1, ED-2 and ED-3 in which the first to third quantum dot composites QD-C1, QD-C2 and QD-C3 are included.

In the display device DD of an embodiment, shown in FIG. 11 and FIG. 12, the areas of the emission regions PXA-B, PXA-G and PXA-R may be different from each other. In this case, the area may mean an area on a plane which is defined by a first direction DR1 and a second direction DR2.

The emission regions PXA-B, PXA-G and PXA-R may have different areas according to the color of a light emitted from the emission layers EML-B, EML-G and EML-R of the light emitting diodes ED-1, ED-2 and ED-3. For example, referring to FIG. 11 and FIG. 12, in the display device DD of an embodiment, the blue emission region PXA-B corresponding to the first light emitting diode ED-1 which emits blue light may have the largest area, and the green emission region PXA-G corresponding to the second light emitting diode ED-2 which generates green light may have the smallest area. However, an embodiment of the present disclosure is not limited thereto, and the emission regions PXA-B, PXA-G and PXA-R may emit light other than blue light, green light and red light, or the emission regions PXA-B, PXA-G and PXA-R may have the same area. Otherwise, the emission regions PXA-B, PXA-G and PXA-R may be provided to have an area ratio different from that shown in FIG. 11.

Each of the emission regions PXA-B, PXA-G and PXA-R may be a region divided by a pixel defining layer PDL. The non-emission regions NPXA may be regions between neighboring emission regions PXA-B, PXA-G and PXA-R and corresponding to the pixel defining layer PDL. Meanwhile, each of the emission regions PXA-B, PXA-G and PXA-R may correspond to a pixel in the present disclosure. The pixel defining layer PDL may divide the light emitting diodes ED-1, ED-2 and ED-3. The emission layers EML-B, EML-G and EML-R of the light emitting diodes ED-1, ED-2 and ED-3 may be located and divided in opening parts OH defined by the pixel defining layer PDL.

The pixel defining layer PDL may be formed using a polymer resin. For example, the pixel defining layer PDL may be formed by including a polyacrylate-based resin or a polyimide-based resin. In addition, the pixel defining layer PDL may be formed by further including an inorganic material in addition to a polymer resin. Meanwhile, the pixel defining layer PDL may be formed by including a light absorbing material or may be formed by including a black pigment or a black dye. The pixel defining layer PDL formed by including the black pigment or the black dye may realize a black pixel defining layer. In forming the pixel defining layer PDL, carbon black may be used as the black pigment or the black dye, but an embodiment of the present disclosure is not limited thereto.

In addition, the pixel defining layer PDL may be formed using an inorganic material. For example, the pixel defining layer PDL may be formed by including silicon nitride ($SiN_x$), silicon oxide ($SiO_x$), silicon oxynitride ($SiO_xN_y$), etc. The pixel defining layer PDL may define the emission regions PXA-B, PXA-G and PXA-R. For example, the emission regions PXA-B, PXA-G and PXA-R and the non-emission region NPXA may be divided by the pixel defining layer PDL.

The light emitting diodes ED-1, ED-2 and ED-3 may include a first electrode EL1, a hole transport region HTR, emission layers EML-B, EML-G and EML-R, an electron transport region ETR, and a second electrode EL2. In the light emitting diodes ED-1, ED-2 and ED-3 included in the display device DD of an embodiment, the same explanation referring to FIG. 4, etc. may be applied for the first electrode EL1, the hole transport region HTR, the electron transport region ETR and the second electrode EL2 except that the quantum dot composites QD-C1, QD-C2 and QD-C3 included in the emission layers EML-B, EML-G and EML-R are different from each other.

The sealing layer TFE may cover the light emitting diodes ED-1, ED-2 and ED-3. The sealing layer TFE may be one layer or a stacked layer of a plurality of layers. The sealing layer TFE may be a thin film sealing layer. The sealing layer TFE protects the light emitting diodes ED-1, ED-2 and ED-3. The sealing layer TFE may cover the top surface of the second electrode EL2 in the opening part OH, and may fill the opening part OH.

Meanwhile, in FIG. 12, etc., the hole transport region HTR and the electron transport region ETR are shown to cover the pixel defining layer PDL and to be provided as common layers, but an embodiment of the present disclosure is not limited thereto. In an embodiment, the hole transport region HTR and the electron transport region ETR may be in the opening part OH defined by the pixel defining layer PDL.

For example, in case of providing the hole transport region HTR and the electron transport region ETR as well as the emission layers EML-B, EML-G and EML-R by an ink jet printing method, the hole transport region HTR, the emission layers EML-B, EML-G and EML-R, the electron transport region ETR, etc. may be correspondingly provided on the opening part OH defined in the pixel defining layer PDL. However, an embodiment of the present disclosure is not limited thereto, and as shown in FIG. 12, irrespective of the providing method of each functional layer, each of the hole transport region HTR and the electron transport region ETR may not be patterned but may be provided to cover the pixel defining layer PDL as one common layer.

Meanwhile, in the display device DD of an embodiment shown in FIG. 12, the thicknesses of the emission layers EML-B, EML-G and EML-R of the first to third light emitting diodes ED-1, ED-2 and ED-3 are shown to be similar, but an embodiment of the present disclosure is not limited thereto. For example, in an embodiment, the thicknesses of the emission layers EML-B, EML-G and EML-R of the first to third light emitting diodes ED-1, ED-2 and ED-3 may be different from each other.

Referring to FIG. 11, the blue emission regions PXA-B and the red emission regions PXA-R may be alternately arranged in a first direction DR1 to form a first group PXG1. The green emission regions PXA-G may be arranged in the first direction DR1 to form a second group PXG2.

The first group PXG1 and the second group PXG2 may be separately in the direction of a second direction DR2. Each of the first group PXG1 and the second group PXG2 may be provided in plurality. The first groups PXG1 and the second groups PXG2 may be alternately arranged along the second direction DR2.

One green emission region PXA-G may be separately located from one blue emission region PXA-B or one red emission region PXA-R in the direction of a fourth direction DR4. The direction of the fourth direction DR4 may be a direction between the first direction DR1 and the second direction DR2.

The arrangement structure of the emission regions PXA-B, PXA-G and PXA-R shown in FIG. 11 may be referred to as a pentile structure. However, the arrangement structure of the emission regions PXA-B, PXA-G and PXA-R in the display device DD according to an embodiment is not limited to the arrangement structure shown in FIG. 11. For example, in an embodiment, the emission regions PXA-B, PXA-G and PXA-R may have a stripe structure, wherein the blue emission region PXA-B, the green emission region PXA-G and the red emission region PXA-R are arranged by turns along the first direction DR1.

Referring to FIG. 3 and FIG. 12, the display device DD of an embodiment may further include a light controlling layer PP. The light controlling layer PP may block external light incident to the display panel DP from the exterior of the display device DD. The light controlling layer PP may block a portion of the external light. The light controlling layer PP may achieve a reflection preventing or reducing function for minimizing or reducing the reflection by the external light.

In an embodiment shown in FIG. 12, the light controlling layer PP may include a color filter layer CFL. For example, the display device DD of an embodiment may further include a color filter layer CFL on the light emitting diodes ED-1, ED-2 and ED-3 of the display panel DP.

In the display device DD of an embodiment, the light controlling layer PP may include a base layer BL and a color filter layer CFL.

The base layer BL may be a member providing a base surface where the color filter layer CFL, etc. is on. The base layer BL may be a glass substrate, a metal substrate, a plastic substrate, etc. However, an embodiment of the present disclosure is not limited thereto, and the base layer BL may be an inorganic layer, an organic layer or a composite material layer.

The color filter layer CFL may include a light blocking part BM and a color filter part CF. The color filter part CF may include a plurality of filters CF-B, CF-G and CF-R. In some embodiments, the color filter layer CFL may include a first filter CF-B which transmits the first color light, a second filter CF-G which transmits the second color light, and a third filter CF-R which transmits the third color light. For example, the first filter CF-B may be a blue filter, the second filter CF-G may be a green filter, and the third filter CF-R may be a red filter.

The filters CF-B, CF-G and CF-R each may include a polymer photosensitive resin and a pigment or dye. The first filter CF-B may include a blue pigment or dye, the second filter CF-G may include a green pigment or dye, and the third filter CF-R may include a red pigment or dye.

Meanwhile, an embodiment of the present disclosure is not limited thereto, and the first filter CF-B may not include a pigment or a dye. The first filter CF-B may include a polymer photosensitive resin but not include a pigment or a dye. The first filter CF-B may be transparent. The first filter CF-B may be formed using a transparent photosensitive resin.

The light blocking part BM may be a black matrix. The light blocking part BM may be formed by including an organic light blocking material or an inorganic light blocking material, which includes a black pigment or a black dye. The light blocking part BM may prevent or reduce a light leakage phenomenon and divide boundaries between adjacent filters CF-B, CF-G and CF-R.

The color filter layer CFL may further include a buffer layer BFL. For example, the buffer layer BFL may be a protection layer protecting the filters CF-B, CF-G and CF-R. The buffer layer BFL may be an inorganic layer including at least one inorganic material among silicon nitride, silicon oxide, and silicon oxynitride. The buffer layer BFL may be formed as a single layer or as a plurality of layers.

In an embodiment shown in FIG. 12, the first color filter CF-B of the color filter layer CFL is shown to be overlapped with the second filter CF-G and the third filter CF-R, but an embodiment of the present disclosure is not limited thereto. For example, the first to third filters CF-B, CF-G and CF-R may be divided by the light blocking part BM and non-overlapped with each other. Meanwhile, in an embodiment, the first to third filters CF-B, CF-G and CF-R may be located correspondingly to the blue emission region PXA-B, green emission region PXA-G and red emission region PXA-R, respectively.

Different from the diagram in FIG. 12, etc., the display device DD of an embodiment may include a polarization layer instead of the color filter layer CFL as the light controlling layer PP. The polarization layer may block or reduce external light incident to the display panel DP. The polarization layer may partially block the external light.

In addition, the polarization layer may decrease reflected light at the display panel DP by the external light. For example, the polarization layer may carry out a blocking or reducing function of reflected light in case where the incident light from the exterior of the display device DD is incident to the display panel DP and then reflected again. The polarization layer may be a circularly polarizer (e.g., may be circularly polarized) having a reflection preventing or reducing function or the polarization layer may include a λ/4 phase retarder from a linear polarizer. Meanwhile, the polarization layer may be on the base layer BL and exposed, or the polarization layer may be under the base layer BL.

The display device of an embodiment includes a quantum dot composite in which a ligand including a body part having a charge transport moiety is combined with (e.g., bonded to) a quantum dot in an emission layer, and the degradation of charge injection properties may be prevented or reduced and thus, excellent luminous efficiency may be achieved.

Figure 14:
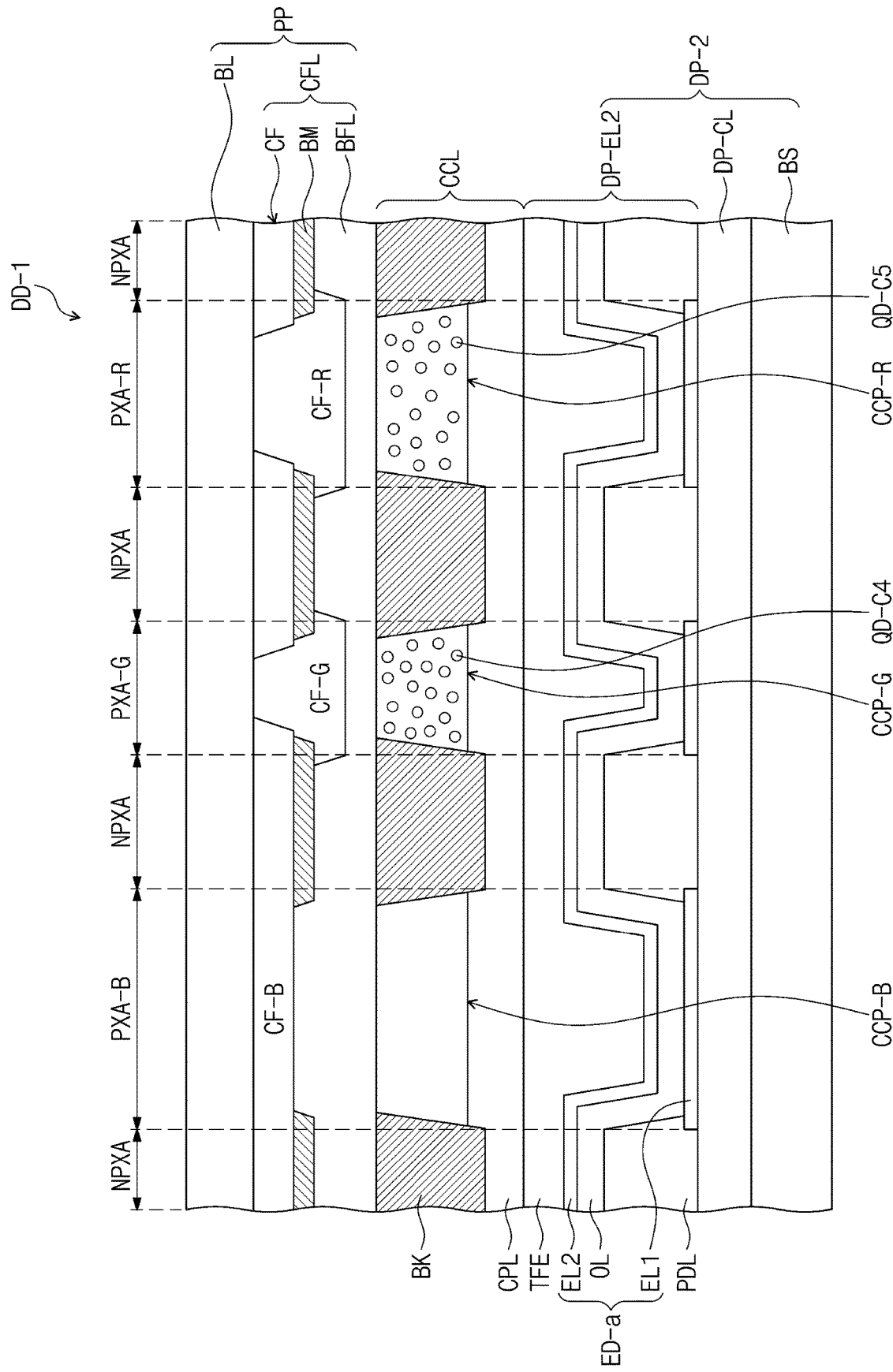
FIG. 14 is a cross-sectional view of a display device of an embodiment.

FIG. 14 is a cross-sectional view of a display device DD-1 of an embodiment of the present disclosure. In explaining on the display device DD-1 of an embodiment, the overlapping contents with the explanation referring to FIG. 1 to FIG. 13 will not be repeated here and the explanation will focus on differences.

Referring to FIG. 14, the display device DD-1 of an embodiment may include a light conversion layer CCL on a display panel DP-2. In addition, the display device DD-1 may further include a color filter layer CFL. The color filter layer CFL may be between a base layer BL and the light conversion layer CCL.

The display panel DP-2 may be an emission type display panel. For example, the display panel DP-2 may be an organic electroluminescence display panel, or a quantum dot emitting display panel.

The display panel DP-2 may include a base substrate BS, a circuit layer DP-CL provided on the base substrate BS, and a display device layer DP-EL2.

The display device layer DP-EL2 includes a light emitting diode ED-a, and the light emitting diode ED-a may include oppositely a first electrode ED facing a second electrode EL2, and a plurality of layers OL between the first electrode EL1 and the second electrode EL2. The plurality of layers OL may include a hole transport region HTR (FIG. 4), an emission layer EML (FIG. 4), and an electron transport region ETR (FIG. 4). A sealing layer TFE may be on the light emitting diode ED-a.

In the light emitting diode ED-a, the same explanation referring to FIG. 4 above may be applied for the first electrode EL, the hole transport region HTR, the electron transport region ETR, and the second electrode EL2. However, in the light emitting diode ED-a included in the display panel DP-2 of an embodiment, the emission layer may include a host and a dopant, which are materials for organic electroluminescence, or may include the quantum dot composite described with reference to FIG. 1 to FIG. 13. In the display panel DP-2 of an embodiment, the light emitting diode ED-a may emit blue light.

The light conversion layer CCL may include a plurality of barrier parts BK separately located from each other and light controlling parts CCP-B, CCP-G and CCP-R, which are between the barrier parts BK. The barrier part BK may be formed by including a polymer resin and a color developing additive. The barrier part BK may be formed by including a light absorbing material or may be formed by including a pigment or a dye. For example, the barrier part BK may be formed by including a black pigment or a black dye to realize a black barrier part. During forming the black barrier part, carbon black, etc. may be used as the black pigment or the black dye, but an embodiment of the present disclosure is not limited thereto.

The light conversion layer CCL may include a first light controlling part CCP-B transmitting first light, a second light controlling part CCP-G including a fourth quantum dot composite QD-C4 for converting the first light into second light, and a third light controlling part CCP-R including a fifth quantum dot composite QD-05 for converting the first light into third light. The second light may be light in a longer wavelength region than the first light, and the third light may be light in a longer wavelength region than the first light and the second light. For example, the first light may be blue light, the second light may be green light, and the third light may be red light. For the quantum dot composites QD-C4 and QD-05 included in the light controlling parts CCP-B, CCP-G and CCP-R, the same explanation on the quantum dot composites used in the emission layer shown in FIG. 12 may be applied.

The light conversion layer CCL may further include a capping layer CPL. The capping layer CPL may be on the light controlling parts CCP-B, CCP-G and CCP-R, and the barrier part BK. The capping layer CPL may play the role of preventing or reducing the penetration of moisture and/or oxygen (hereinafter, will be referred to as "moisture/oxygen"). The capping layer CPL may be on the light controlling parts CCP-B, CCP-G and CCP-R and block or reduce the exposure of the light controlling parts CCP-B, CCP-G and CCP-R to moisture/oxygen. The capping layer CPL may include at least one inorganic layer.

The display device DD-1 of an embodiment may include a color filter layer CFL on the light conversion layer CCL, and the same explanation with reference to FIG. 12 may be applied to the color filter layer CFL and the base layer BL.

In the quantum dot composition of an embodiment, a ligand which is combined with (e.g., bonded to) the surface of a quantum dot includes a charge injecting moiety, and thus, though applied to an emission layer, the quantum dot composition may be used as a material for an emission layer, achieving improved luminous efficiency properties without degrading charge injecting properties.

The light emitting diode and the display device of embodiments include a quantum dot which does not degrade charge injecting properties in an emission layer, and improved luminous efficiency and increased device life may be achieved.

Although certain embodiments of the present disclosure have been described, it is understood that various changes and modifications can be made by one of ordinary skill in the art within the spirit and technical scope of the present disclosure as described in the appended claims, and equivalents thereof.

Accordingly, the technical scope of the present disclosure is to be determined by the following claims, and equivalents thereof, and shall not be restricted or limited by the foregoing detailed description.

What is claimed is:

1. A quantum dot composition, comprising:

a quantum dot; and a ligand bonded to a surface of the quantum dot, wherein the ligand comprises:

a body part comprising a charge transport moiety; and a head part combined with the surface of the quantum dot, wherein the ligand further comprises a chain part connecting the body part and the head part, and wherein the body part is represented by the following Formula 1-2:

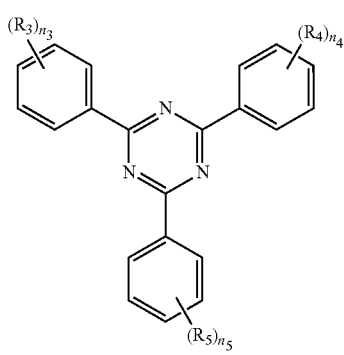

Formula 1-2

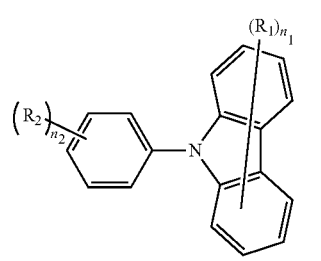

Formula 1-1

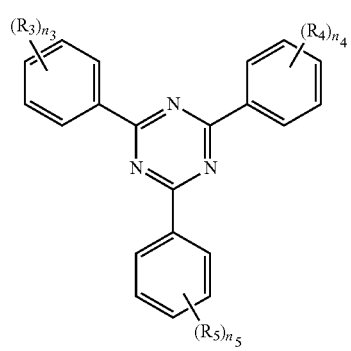

Formula 1-2 in Formula 1-2,

R$_3$ to R$_5$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms for forming a ring, or a substituted or unsubstituted heteroaryl group of 2 to 60 carbon atoms for forming a ring, and n$_3$ to n$_5$ are each independently an integer of 0 to 5.

2. The quantum dot composition of claim 1, wherein the chain part is a substituted or unsubstituted alkyl group, a substituted or unsubstituted amine group, a substituted or unsubstituted oxy group, a substituted or unsubstituted thio group, a substituted or unsubstituted ester group, or a substituted or unsubstituted amide group.

3. The quantum dot composition of claim 1, wherein the ligand is a monodentate ligand or a bidentate ligand.

4. The quantum dot composition of claim 1, wherein the head part comprises at least one thiol group.

5. The quantum dot composition of claim 1, wherein the quantum dot comprises a core and a shell at least partially surrounding the core.

6. The quantum dot composition of claim 1, further comprising an organic solvent.

7. A light emitting diode, comprising:
a first electrode;
a hole transport region on the first electrode;
an emission layer on the hole transport region and comprising a quantum dot and a ligand bonded to a surface of the quantum dot;
an electron transport region on the emission layer; and
a second electrode on the electron transport region,
wherein the ligand comprises:
a body part comprising a charge transport moiety; and
a head part bonded to the surface of the quantum dot,
wherein the hole transport region comprises a first hole transport material, and
the first hole transport material and the body part each comprise a moiety having the same composition.

8. The light emitting diode of claim 7, wherein the body part is represented by the following Formula 1-1 or Formula 1-2:

in Formula 1-1 and Formula 1-2,

R$_1$ to R$_5$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms for forming a ring, or a substituted or unsubstituted heteroaryl group of 2 to 60 carbon atoms for forming a ring, n$_1$ is an integer of 0 to 8, and n$_2$ to n$_5$ are each independently an integer of 0 to 5.

9. The light emitting diode of claim 7, wherein the quantum dot comprises a core and a shell at least partially surrounding the core, and the head part comprises at least one thiol group.

10. A light emitting diode, comprising:
a first electrode;
a hole transport region on the first electrode;
an emission layer on the hole transport region and comprising a quantum dot and a ligand bonded to a surface of the quantum dot;
an electron transport region on the emission layer; and
a second electrode on the electron transport region,
wherein the ligand comprises:
a body part comprising a charge transport moiety; and
a head part bonded to the surface of the quantum dot, and
wherein the electron transport region comprises a first electron transport material, and
the first electron transport material and the body part each comprise a moiety having the same composition.

11. A display device comprising a plurality of light emitting diodes, wherein each of the plurality of light emitting diodes comprises:
a first electrode;
a second electrode facing the first electrode; and
an emission layer between the first electrode and the second electrode and comprising a quantum dot and a ligand bonded to a surface of the quantum dot,
wherein the ligand comprises:
a body part having charge transport properties; and
a head part bonded to the surface of the quantum dot, wherein the ligand further comprises a chain part connecting the body part and the head part, and wherein the body part is represented by the following Formula 1-2:

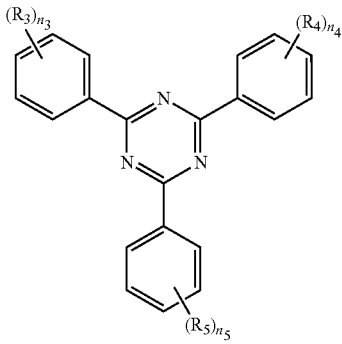

Formula 1-2 in Formula 1-2, $R_3$ to $R_5$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms for forming a ring, or a substituted or unsubstituted heteroaryl group of 2 to 60 carbon atoms for forming a ring, and $n_3$ to $n_5$ are each independently an integer of 0 to 5.

12. The display device of claim 11, wherein the plurality of light emitting diodes comprise:

a first light emitting diode, and the quantum dot of the first light emitting diode is a first quantum dot to emit a first light;

a second light emitting diode, and the quantum dot of the second light emitting diode is a second quantum dot to emit a second light having a longer wavelength than the first light; and a third light emitting diode, and the quantum dot of the third light emitting diode is a third quantum dot to emit a third light having a longer wavelength than the first light and the second light.

13. The display device of claim 12, wherein:

the ligand of the first light emitting diode is a first ligand bonded to the first quantum dot, the ligand of the second light emitting diode is a second ligand bonded to the second quantum dot, and the ligand of the third light emitting diode is a third ligand bonded to the third quantum dot.

14. The display device of claim 12, further comprising a color filter layer on the plurality of light emitting diodes, wherein the color filter layer comprises:

a first filter to transmit the first light;

a second filter to transmit the second light; and a third filter to transmit the third light.

* * * * *